United States Patent
Mohammadi-Gheidari et al.

(10) Patent No.: US 12,525,422 B2
(45) Date of Patent: Jan. 13, 2026

(54) CHARGED PARTICLE OPTICS COMPONENTS AND THEIR FABRICATION

(71) Applicant: FEI Company, Hillsboro, OR (US)

(72) Inventors: Ali Mohammadi-Gheidari, Best (NL); Alexander Henstra, Utrecht (NL); Luigi Mele, Eindhoven (NL)

(73) Assignee: FEI Company, Hillsboro, OR (US)

( * ) Notice: Subject to any disclaimer, the term of this patent is extended or adjusted under 35 U.S.C. 154(b) by 551 days.

(21) Appl. No.: 17/883,495

(22) Filed: Aug. 8, 2022

(65) Prior Publication Data

US 2024/0047171 A1 Feb. 8, 2024

(51) Int. Cl.
*H01J 37/153* (2006.01)
*G03F 7/00* (2006.01)
(Continued)

(52) U.S. Cl.
CPC .......... *H01J 37/153* (2013.01); *G03F 7/0005* (2013.01); *H01J 37/1472* (2013.01);
(Continued)

(58) Field of Classification Search
CPC ...... H01J 37/153; H01J 37/1472; H01J 37/28; H01J 2237/1516; H01J 2237/1534;
(Continued)

(56) References Cited

U.S. PATENT DOCUMENTS 4,841,143 A * 6/1989 Tamura ................. H01J 37/244
250/397
5,939,725 A * 8/1999 Muraki ................. B82Y 40/00
250/491.1

(Continued)

FOREIGN PATENT DOCUMENTS

JP S6321736 A 1/1988
JP H08115800 A 5/1996
(Continued)

OTHER PUBLICATIONS

European Patent Office Search Report and Written Opinion for Application No. 23190282.6 dated Jul. 31, 2024 (16 pages).
(Continued)

*Primary Examiner* — David A Vanore

(57) ABSTRACT

The present invention is directed to an electrode component with at least two electrodes or a multipole component as generally known in the art. Each of the electrodes can be provided with a beam neighboring section or end section forming the free electrodes. This section is the section exposed to high voltages, i.e. more than 10 KV, and is intended to nevertheless work very reliable and precise with respect to the guidance and/or controlling of a beam of a charged particle beam in a microscope or lithographic apparatus. This neighboring section are positioned in the vicinity or close to a charged particle beam or even facing it. This bears the preferred advantage that high voltages can be generated by the electrodes or to the electrode component and they can withstand those high voltages. This assists in a better guidance and/or controlling of the charged beam, such as for compensating aberration etc. The beam neighboring section can have a surface configured to face the beam. This neighboring section or surface are fabricated with absolute dimensional tolerances less than a desired maximum absolute dimensional tolerance wherein the desired maximum absolute dimensional tolerance is based at least on a maximum voltage to be applied to the electrode. With such a precisely fabricated surface, a more precise and/or efficient field can be generated being able to control the charged particle beam more precisely and efficiently.

20 Claims, 15 Drawing Sheets

(51) Int. Cl.
*H01J 37/147* (2006.01)
*H01J 37/28* (2006.01)

(52) U.S. Cl.
CPC ....... *H01J 37/28* (2013.01); *H01J 2237/1516* (2013.01); *H01J 2237/1534* (2013.01); *H01J 2237/2802* (2013.01)

(58) Field of Classification Search
CPC ....... H01J 2237/2802; H01J 2237/1532; H01J 1/46; H01J 9/14; H01J 37/04; H01J 37/12; H01J 37/15; H01J 37/26; H01J 37/3174; H01J 37/147; H01J 37/023; G03F 7/0005
See application file for complete search history.

(56) References Cited

U.S. PATENT DOCUMENTS

| | | | | |
|---|---|---|---|---|
| 6,617,595 | B1* | 9/2003 | Okunuki | H01J 37/12 250/398 |
| 6,630,677 | B1 | 10/2003 | Zhao et al. | |
| 8,294,096 | B2* | 10/2012 | Banzhof | H01J 37/153 250/306 |
| 2001/0052576 | A1* | 12/2001 | Shimada | G21K 1/087 250/492.1 |
| 2003/0155521 | A1* | 8/2003 | Feuerbaum | H01J 37/256 250/396 R |
| 2003/0209673 | A1 | 11/2003 | Ono et al. | |
| 2004/0119021 | A1* | 6/2004 | Parker | H01J 37/3177 250/396 R |
| 2005/0001178 | A1* | 1/2005 | Parker | H01J 37/065 250/492.23 |
| 2005/0202745 | A1 | 9/2005 | Nishimura | |
| 2008/0067378 | A1* | 3/2008 | Kawasaki | H01J 37/28 250/310 |
| 2008/0230711 | A1* | 9/2008 | Platzgummer | B82Y 10/00 250/492.22 |
| 2011/0253893 | A1* | 10/2011 | Banzhof | H01J 37/153 250/307 |
| 2012/0049064 | A1* | 3/2012 | Ren | H01J 37/28 250/396 ML |
| 2014/0361167 | A1* | 12/2014 | Morishita | H01J 37/28 250/310 |
| 2015/0364290 | A1* | 12/2015 | Enyama | H01J 37/153 250/396 ML |
| 2019/0019649 | A1* | 1/2019 | Winkler | H01J 37/147 |
| 2020/0126751 | A1* | 4/2020 | Kemen | H01J 37/3177 |
| 2024/0047171 | A1* | 2/2024 | Mohammadi-Gheidari | G03F 7/0005 |
| 2024/0128043 | A1* | 4/2024 | Van Soest | H01J 37/12 |

FOREIGN PATENT DOCUMENTS

| | | |
|---|---|---|
| JP | 2001006525 A | 1/2001 |
| JP | 2013165200 A | 8/2013 |
| JP | 2014041947 A | 3/2014 |
| WO | 2022117295 A1 | 6/2022 |

OTHER PUBLICATIONS

EP23190282.6, Extended European Search Report, May 22, 2025, 21 pages.

* cited by examiner

500

600

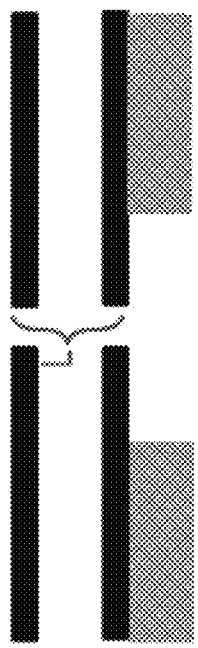
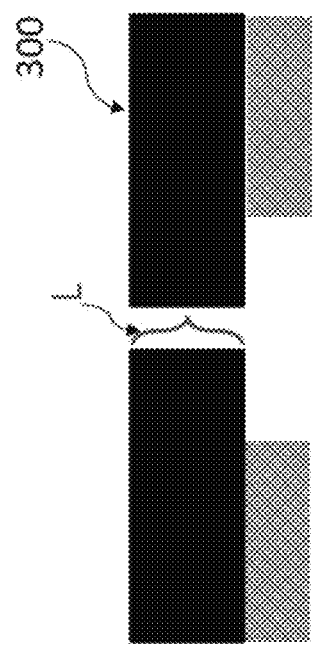
Fig. 10

CHARGED PARTICLE OPTICS COMPONENTS AND THEIR FABRICATION

FIELD

The present invention relates generally to the field of charged particle optics components. More particularly, it relates to active charged particle optics components with electrodes for charged particle beam microscopy or lithography.

BACKGROUND

Charged particle beam microscopes are widely used for imaging and/or processing a sample, or parts thereof. They typically offer higher resolution than optical microscopes owing to the shorter wavelength of the charged particle beam. However, as with optical microscopes, charged particle beam microscopes also suffer from lens aberrations. These aberrations may comprise geometric aberrations, such as spherical aberration, arising from the geometry of microscope components such as rotationally symmetric electromagnetic lenses producing rotationally symmetric fields. Aberrations may also comprise chromatic aberrations, such as dispersion, arising from different effects of microscope components on particles of different energies in the beam. A consequence of these aberrations is the reduction in resolution of the microscopy system. The reduction may be severe and may worsen the resolution of the microscopy system, for example, from tens of pico-meter (pm) to tens of nanometer (nm). Aberration correctors may thus be of significant advantage in microscopy systems, and particularly in charged particle beam microscopes where the low resolution means even small aberrations may be of relevance.

Aberration correctors represent an exemplary active charged particle optics component towards which embodiments of the present technology may be directed. While they may be of advantage in reducing aberration, aberration correctors are typically complex components comprising a number of different multipole elements. Ideally, in an aberration corrector, these multipole elements should be fabricated, aligned and stacked together with an unprecedent mechanical accuracy (typically below 5 μm). However, this isn't usually the case as mechanical errors in fabrication of charged particle optics components, and elements thereof, are typical and may be inherent to the fabrication processes themselves. For example, one such process may be a spark erosion process in which charged particle optics components are fabricated by using an electrode to produce sparks that help erode the work material of the charged particle optics component. These mechanical errors may lead to so-called 'parasitic' aberrations of the microscopy system. Compensating for parasitic aberration may require more extra multipole elements in aberration correctors to be installed in the microscopy system thus resulting in expensive aberration correctors.

SUMMARY

It is an aim of the present invention to provide a charged particle optics component and a respective manufacturing process with a more precise and/or reliable performance and/or with reduced contribution to the parasitic aberration of charged particle beam microscopy systems. Embodiments of the present technology also relate to a method of fabrication of such charged particle optics components.

This aim or object is attained with the below claims and embodiments.

The present invention is directed to a device for the use in charge particle optics and a fabrication or manufacturing process therefor. Any features explicitly stated with respect to one of these categories also apply to the other category although not explicitly stated.

The present invention comprises an electrode component with at least two electrodes or a multipole component as generally known in the art. Each of the electrodes can be provided with a beam neighboring section or end section forming the free electrodes. This section is the section exposed to considerable voltages and is intended to nevertheless work very reliable and precise with respect to the guidance and/or controlling of a beam of a charged particle beam in a microscope or lithographic apparatus. This neighboring section is positioned in the vicinity or close to a charged particle beam or even better facing it.

The beam neighboring section or a beam facing surface can have an absolute dimensional tolerance less than a desired maximum absolute dimensional tolerance. The desired maximum absolute tolerance may be based on a maximum voltage that may be applied to any of the at least two electrodes described above. The desired maximum absolute tolerance may be based also on any of a beam energy, effective length of the electrodes, aberration coefficient of another component, or any other relevant factors.

The beam neighboring section of the electrode component can have a thickness or an effective thickness of at least 0.10 μm, preferably at least 100 μm, more preferably at least 500 μm, more preferably at least 1,000 μm (1 mm). This bears the preferred advantage that the device can be used in charged particle optics with high particle energies as the applicable surface of the electrodes can be increased.

The effective thickness can be established by a classic arrangement of one layer of electrodes and their respective thickness of a beam neighboring section or by more than one layer of electrodes or a stack of electrodes and their aggregated or combined thicknesses and the distance(s) between them. In case of a stack of two electrodes the effective thickness would then result in the combined thickness of each beam neighboring sections of the respective electrodes plus the distance between them. In case of a stack of three electrodes the effective thickness would then result from the thickness of each beam neighboring sections of each electrode or layers of electrodes plus the two distances between them.

The beam neighboring section can have a surface configured to face the beam. This surface can be parallel to a beam axis or inclined to the beam axis. This surface can have a maximum surface roughness of Ra 0.05 μm. With such a precisely fabricated surface, a more precise and/or efficient field can be generated being able to control the charged particle beam more precisely and efficiently.

The beam neighboring section, particularly its surface facing the charged particle beam or its relevant part can have a maximum absolute dimensional tolerance of 1 μm. This is also able to better, more precisely or more efficiently control the charged particle beam.

The term absolute dimensional tolerance is intended to mean a maximum deviation of a pre-set dimensional value of fabrication or manufacturing. Dimensional values can be the values of contour topography, such as of a surface as the beam facing surface, line topography, lengths, diameters etc.

Embodiments of the present technology may be particularly advantageous for the forming or fabricating of active charged particle optics components and may provide a robust, efficient, and precise fabrication process for such components. Active charged particle optics components may be considered as components whose physical effects may be varied during the course of usage. For example, in the context of charged particle microscopy systems, electrostatic multipoles are widely used that cause a deflection of the charged particle beam by a defined angle based on a magnitude of an electrostatic field generated inside the electrostatic multipole. The electrostatic field in the electrostatic multipole may be generated, for example, by applying equal and opposite voltages to a pair of electrodes. This voltage may be varied and thus the deflection angle of the electrostatic multipole may be changed as needed.

The present invention can also involve an alternative fabrication technology that has inherently higher accuracy in fabricating, Thus, no extra multipole elements for the correction of parasitic aberrations may be needed.

According to the present invention a stack of electrodes comprising at least two layers of electrodes along an axis of the beam can be provided. In this case, the effective thickness of the electrodes comprises the thickness of each layer of electrodes and the distance between the electrodes.

This stack then corresponds to a solid and thicker single layer of electrodes.

The beam neighboring section can have a minimum thickness that is configured to be used with a beam with a beam energy of more than 10 KeV. This can control the beam in a more efficient and precise manner. Devices according to the present invention can be also used or configured for lower beam energies.

The term thickness is intended to comprise the dimension of the electrode(s) along the direction of beam propagation.

The beam energy may be understood to comprise a median/average energy of particles in the beam. It may also comprise a maximum energy of particles in the beam.

The present invention also relates to a combination of at least two or all of the preceding features or embodiments.

The minimum thickness can be configured to be used with a beam having a beam energy of at least 15 KeV, at least 20 KeV, more preferably at least 30 KeV, more preferably at least 50 KeV, even more preferably at least 100 KeV, even more preferably at least 150 KeV, even more preferably at least 200 KeV, and even most preferably at least 300 KeV.

The beam facing surface can have a maximum surface roughness of Ra 0.04 µm, preferably a maximum of roughness of Ra of 0.03 µm, more preferable a maximum surface roughness of Ra 0.02 µm, more preferably a maximum surface roughness of Ra 0.01 µm, even more preferably a maximum surface roughness of Ra 0.0075 µm, and most preferably a maximum surface roughness of Ra 0.005 µm. This can assist in preventing any unwanted effects, such as an unwanted or early discharge between the electrodes and/or a more precise operation of the device and control of the beam.

The beam facing surface can have a maximum absolute dimensional tolerance of 0.9 µm, preferably of 0.8 µm, more preferably of 0.7 µm, even more preferably of 0.6 µm, even more preferably of 0.5 µm even more preferably of 0.4 µm even more preferably of 0.3 µm even more preferably of 0.2 µm even more preferably a maximum absolute dimensional tolerance of 0.1 µm, even more preferably of 0.05 µm, and most preferably a maximum absolute dimensional tolerance of 0.02 µm. These tolerances depend on the high-precision fabrication process chosen. This can assist in a more reliable and precise control of the charged particle beam and the prevention of any unwanted effects, such as an unwanted or early discharge between the electrodes.

The device preferably works as an aberration corrector where all the before features help to work more efficient and with a higher precision.

The present invention also embraces the forming of at least the end sections or beam neighboring sections of the electrodes.

The device can further comprise or can be attached to a substrate for supporting the electrodes, preferably with electrically insulating properties. The electrode component can thus be isolated or electrically shielded. The substrate can comprise any of glass, Pyrex, and/or a (semi-) conductive material covered with insulating material, such as silicon oxide.

The substrate can have a thickness of at least 100 µm, preferably at least 500 µm, more preferably at least 1,000 µm or 1 mm, preferably at least 1,250 µm, more preferably at least 1,500 µm, even more preferably at least 2,000 µm, even more at least 2,500 µm, even more at least 3,000 µm, and most preferably at least 5,000 µm. This is relevant or crucial for the application of these elements at higher beam energies.

The substrate can be attached or fixed to the electrode component and can have one or more substrate beam surface(s) flush or aligned with the beam facing surfaces. The electrode component and the substrate can be arranged or fixed together directly or by an intermediate layer. This can be realized by a wafer bond and/or by being glued together.

The electrode component can have connectors configured to be connected with a voltage source. The thickness of the electrode component can be equal over its extension or different. The connectors could also be formed in and/or on a circuit board and connected to the electrodes.

The electrode component can be a multipole component with 2×N poles, with N being an integer. 2, four, six, eight poles or even more can be provided, such as 16, 24 or 32, just to mention examples. The number of electrodes depends on the intended function of the optical elements.

At least two pathways for charged particle beams can be provided by an or one electrode component. This has to be formed, particularly its electrodes to define the multiple pathways. E.g., a quadrupole for each of the two charged particle beams can provided, with one common electrode being positioned between the two pathways. Thus, two quadrupoles can share a common electrode.

The electrode component can comprise at least two indexing markers in order to align the electrode component with any other component, such as the substrate, particularly when being assembled.

The indexing markers can comprise four micro holes in at least one of the components, such as the electrode component. The alignment tolerances can amount to at most 1 µm in any lateral or axial orientation. The alignment tolerances in any lateral or axial orientation can amount at most 1 µm.

The alignment tolerances in any angular orientation of the components in plane orientation amount can amount to at most 5, preferably 3 mrad.

The alignment tolerances in any tilting orientation of the components to each other amount to at most 1 mrad, meaning an inclination of planes of the electrode component and of the substrate.

The device can be formed by a high-precision forming process. This comprises any process with manufacturing tolerances of 1 µm at most, such as lithography, reactive ion etching (RIE), deep reactive ion etching (DRIE), deep dry etching, wet etching, the forming of silicon wafers, deposit coating (e.g., sputtering, CVD, ALD).

At least the neighboring section of the electrodes or the entire electrodes can be formed from conductive Si-wafer material and/or semiconductor Si-wafer with a metal coating.

It is understood that the devices described in this filing may be used within various optical components, including but not limited to the methods and systems disclosed in U.S. Pat. No. 12,394,587 titled SIMPLE SPHERICAL ABERRATION CORRECTOR FOR SEM and filed on Aug. 8, 2022, which is hereby incorporated by reference in its entirety.

Below is a list of device embodiments. Those will be indicated with a letter "D". Whenever such embodiments are referred to, this will be done by referring to "D" embodiments.

D1. A device for the use in charge particle optics comprising:
- an electrode component (302) with at least two electrodes (302a,b), each being provided with a beam neighboring section,
- the beam neighboring section having an absolute dimensional tolerance less than a desired maximum absolute dimensional tolerance, wherein the desired maximum absolute dimensional tolerance is based at least on a maximum voltage to be applied to any of the at least two electrodes (302a,b).

D2. A device for the use in charge particle optics comprising:
- an electrode component (302) with at least two electrodes (302a,b), each being provided with a beam neighboring section,
    - the beam neighboring section having a maximum absolute dimensional tolerance of 1 µm.

D3. A device for the use in charge particle optics comprising:
- an electrode component (302) with at least two electrodes (302a,b), each being provided with a beam neighboring section,
    - the beam neighboring section having a surface (302c) configured to face the beam with a maximum surface roughness of Ra 0.05 µm.

D4. A device for the use in charged particle optics comprising:
- an electrode component (302) with at least two electrodes (302,a,b), each being provided with a beam neighboring section with a minimum effective thickness that is configured to be used with a beam energy of more than 10 KeV.

D5. The device according to a combination of at least two of any of the preceding device embodiments.

D6. The device according to any preceding device embodiments with a stack of electrodes comprising at least two layers of electrodes along an axis of the beam.

D7. The device according to the preceding device embodiment wherein the electrodes define an effective thickness (L) along the axis of the beam.

D8. The device according to the preceding device embodiment wherein the effective thickness (L) of the electrodes comprises the thickness of each layer of electrodes and the distance between the electrodes.

D9. The device according to any of the two preceding device embodiments wherein the desired maximum absolute dimensional tolerance is based also on the effective thickness (L) of the electrodes.

D10. A device according to any of the preceding device embodiments wherein the beam neighboring section has an effective thickness (L) of at least 0.10 µm.

D11. A device according to any of the preceding device embodiments wherein the beam neighboring section has an effective thickness of at least 100 µm.

D12. The device according to any of the preceding device embodiments wherein the minimum effective thickness of the beam neighboring section is 500 µm.

D13. The device according to any of the relevant preceding device embodiments wherein the minimum effective thickness of the beam neighboring section is 1,000 µm.

D14. The device according to any of the two preceding device embodiments wherein the minimum effective thickness of the beam neighboring section is 1,250 µm.

D15. The device according to any of the two preceding device embodiments wherein the minimum effective thickness of the beam neighboring section is 1,500 µm.

D16. The device according to any of the two preceding device embodiments wherein the minimum effective thickness of the beam neighboring section is 2,000 µm.

D17. The device according to any of the two preceding device embodiments wherein the minimum effective thickness of the beam neighboring section is 2,500 µm.

D18. The device according to any of the two preceding device embodiments wherein the minimum effective thickness of the beam neighboring section is 3,000 µm.

D19. The device according to any of the two preceding device embodiments wherein the minimum effective thickness of the beam neighboring section is 5,000 µm.

D20. The device according to any of the two preceding device embodiments wherein the minimum effective thickness is configured to be used with a beam energy of at least 15 KeV.

D21. The device according to any of the three preceding device embodiments wherein the minimum effective thickness is configured to be used with a beam energy of at least 20 KeV.

D22. The device according to any of the four preceding device embodiments wherein the minimum effective thickness is configured to be used with a beam energy of at least 30 KeV.

D23. The device according to any of the five preceding device embodiments wherein the minimum effective thickness is configured to be used with a beam energy of at least 50 KeV.

D24. The device according to any of the six preceding device embodiments wherein the minimum effective thickness is configured to be used with a beam energy of at least 100 KeV.

D25. The device according to any of the seven preceding device embodiments wherein the minimum effective thickness is configured to be used with a beam energy of at least 150 KeV.

D26. The device according to any of the eight preceding device embodiments wherein the minimum effective thickness is configured to be used with a beam energy of at least 200 KeV.

D27. The device according to any of the nine preceding device embodiments wherein the minimum effective thickness is configured to be used with a beam energy of at least 300 KeV.

D28. The device according to any of the ten preceding device embodiments wherein the desired maximum absolute dimensional tolerance is based also on the beam energy.

D29. The device according to any of the preceding device embodiments wherein the beam facing surface (302c) has a maximum surface roughness of Ra 0.04 µm.

D30. The device according to any of the preceding device embodiments wherein the beam facing surface (302c) has a maximum surface roughness of Ra 0.03 μm.

D31. The device according to any of the preceding device embodiments wherein the beam facing surface (302c) has a maximum surface roughness of Ra 0.025 μm.

D32. The device according to any of the preceding device embodiments wherein the beam facing surface (302c) has a maximum surface roughness of Ra 0.02 μm.

D33. The device according to any of the preceding device embodiments wherein the beam facing surface (302c) has a maximum surface roughness of Ra 0.01 μm.

D34. The device according to any of the preceding device embodiments wherein the beam facing surface (302c) has a maximum surface roughness of Ra 0.0075 μm.

D35. The device according to any of the preceding device embodiments wherein the beam facing surface (302c) has a maximum surface roughness of Ra 0.005 μm.

D36. The device according to any of the preceding device embodiments wherein the beam facing surface (302c) has a maximum absolute dimensional tolerance of 0.9 μm.

D37. The device according to any of the preceding device embodiments wherein the beam facing surface (302c) has a maximum absolute dimensional tolerance of 0.8 μm.

D38. The device according to any of the preceding device embodiments wherein the beam facing surface (302c) has a maximum absolute dimensional tolerance of 0.7 μm.

D39. The device according to any of the preceding device embodiments wherein the beam facing surface (302c) has a maximum absolute dimensional tolerance of 0.6 μm.

D40. The device according to any of the preceding device embodiments wherein the beam facing surface (302c) has a maximum absolute dimensional tolerance of 0.5 μm.

D41. The device according to any of the preceding device embodiments wherein the beam facing surface (302c) has a maximum absolute dimensional tolerance of 0.4 μm.

D42. The device according to any of the preceding device embodiments wherein the beam facing surface (302c) has a maximum absolute dimensional tolerance of 0.3 μm.

D43. The device according to any of the preceding device embodiments wherein the beam facing surface (302c) has a maximum absolute dimensional tolerance of 0.2 μm.

D44. The device according to any of the preceding device embodiments wherein the beam facing surface (302c) has a maximum absolute dimensional tolerance of 0.1 μm.

D45. The device according to any of the preceding device embodiments wherein the beam facing surface (302c) has a maximum absolute dimensional tolerance of 0.05 μm.

D46. The device according to any of the preceding device embodiments wherein the beam facing surface (302c) has a maximum absolute dimensional tolerance of 0.02 μm.

D47. The device according to any of the preceding device embodiments wherein the device is configured for being implemented in an aberration corrector.

D48. The device according to any of the preceding device embodiments further comprising a substrate (306) for supporting the electrodes having electrically insulating properties.

D49. The device according to the preceding device embodiment wherein the substrate (306) comprises any of glass, Pyrex, and/or a conductive material covered with insulating material, such as silicon oxide.

D50. The device according to the preceding device embodiment wherein the substrate (306) has a thickness of at least 100 μm.

D51. The device according to the preceding device embodiment wherein the substrate (306) has a thickness of at least 500 μm.

D52. The device according to the preceding device embodiment wherein the substrate (306) has a thickness of at least 1,000 μm.

D53. The device according to any of the two preceding device embodiments wherein the substrate (306) has a thickness of at least 1,250 μm.

D54. The device according to any of the three preceding device embodiments wherein the substrate (306) has a thickness of at least 1,500 μm.

D55. The device according to any of the four preceding device embodiments wherein the substrate (306) has a thickness of at least 2,000 μm.

D56. The device according to any of the five preceding device embodiments wherein the substrate (306) has a thickness of at least 2,500 μm.

D57. The device according to any of the six preceding device embodiments wherein the substrate (306) has a thickness of at least 3,000 μm.

D58. The device according to any of the seven preceding device embodiments wherein the substrate (306) has a thickness of at least 5,000 μm.

D59. The device according to any of the eight preceding device embodiments wherein the substrate (306) is fixed to the electrode component (302) and has at least one substrate beam facing surface(s) flush with the beam facing surfaces (302c).

D60. The device according to the preceding device embodiment wherein the electrode component (302) and the substrate (306) are fixed together by an intermediate layer (304).

D61. The device according to the preceding device embodiment wherein the electrode component (302) and the substrate (306) are fixed together by a wafer bond.

D62. The device according to the preceding device embodiment wherein the electrode component (302) and the substrate (306) are glued together.

D63. The device according to any of the preceding device embodiments wherein the electrode component (302) has connectors configured to be connected with a voltage source.

D64. The device according to any of the preceding device embodiments wherein the electrode component (302) is a multipole component with 2×N poles, with N being an integer.

D65. The device according to any of the preceding device embodiments forming at least two pathways for charged particle beams.

D66. The device according to the preceding device embodiment wherein a multipole, such as a quadrupole, for each of the two charged particle beams is provided.

D67. The device according to the preceding device embodiment wherein the two quadrupoles share a common electrode.

D68. The device according to any of the preceding device embodiments wherein electrode components (302) comprise at least two indexing markers (408) in order to align the electrode component (302) with any other component, such as the substrate (306).

D69. The device according to any of the two preceding device components wherein the indexing markers (408) comprise four micro holes (408) in at least one of the components, such as the electrode component.

D70. The device according to any of the three preceding device embodiments wherein the alignment tolerances are at most 1 μm in any lateral or axial orientation.

D71. The device according to any of the four the preceding device embodiment wherein the alignment tolerances in any lateral or axial orientation amount at most 1 μm.

D72. The device according to any of the five preceding device embodiments wherein the alignment tolerances in any angular orientation of the components in plane orientation amount to at most 5 mrad.

D73. The device according to any of the six preceding device embodiments wherein the alignment tolerances in any tilting orientation of the components to each other amount to at most 1 mrad.

D74. The device according to any of the preceding device embodiments having been formed by a high-precision forming process.

D75. An aberration corrector with a device according to any of the preceding embodiments.

Below is a list of Assembly embodiments. Those will be indicated with a letter "A". Whenever such embodiments are referred to, this will be done by referring to "A" embodiments.

A1. Assembly of a device according to any of the preceding device embodiments for use in charged particle optics.

A2. A charged particle beam microscope with an assembly according to the preceding assembly embodiment.

A3. A charged particle beam lithography system with an assembly according to the assembly embodiment A1.

Below is a list of Method embodiments. Those will be indicated with a letter "M". Whenever such embodiments are referred to, this will be done by referring to "M" embodiments.

M1. Method of fabrication of a device for the use in charge particle optical instruments comprising the steps of forming an electrode component with at least two electrodes, each being provided with a beam neighboring section having an absolute dimensional tolerance less than a desired maximum absolute dimensional tolerance wherein the desired maximum absolute dimensional tolerance is based at least on a maximum voltage to be applied to the electrode.

M2. Method of fabrication of a device for the use in charge particle optical instruments comprising the steps of forming an electrode component with at least two electrodes, each being provided with a beam neighboring section having a maximum absolute dimensional tolerance of 1 μm.

M3. Method of fabrication of a device for the use in charge particle optical instruments comprising the steps of forming an electrode component with at least two electrodes, each being provided with a beam neighboring section having a surface configured to face the beam with a maximum surface roughness of Ra 0.05 μm.

M4. Method of fabrication of a device for the use in charged particle optics comprising an electrode component with at least two electrodes, each being provided with a beam neighboring section with a minimum effective thickness that is configured to be used with a beam energy of more than 10 KeV.

M5. Method of fabrication of a device for the use in charged particle optics comprising an electrode component with at least two electrodes, each being provided with a beam neighboring section being formed with a high-precision forming process.

M6. Method according to a combination of at least two of any of the preceding method embodiments.

M7. Method according to any preceding method embodiments with the step(s) of forming a stack of electrodes comprising at least two layers of electrodes along an axis of the beam.

M8. Method according to the preceding method embodiment wherein the electrodes define an effective thickness (L) along the axis of the beam.

M9. Method according to the preceding method embodiment wherein the effective thickness (L) of the electrodes comprises the thickness of each layer of electrodes and the distance between the electrodes.

M10. Method according to any of the two preceding method embodiments wherein the desired maximum absolute dimensional tolerance is based also on the effective thickness (L) of the electrodes.

M11. The method according to any of the preceding method embodiments wherein the minimum effective thickness of the beam neighboring section is 0.10 μm.

M12. The method according to any of the preceding method embodiments wherein the minimum effective thickness of the beam neighboring section is 100 μm M13. The method according to any of the preceding method embodiments wherein the minimum effective thickness of the beam neighboring section is 500 μm.

M14. The method according to any of the two preceding device embodiments wherein the minimum effective thickness of the beam neighboring section is 1,000 μm.

M15. The method according to any of the two preceding device embodiments wherein the minimum effective thickness of the beam neighboring section is 1,250 μm.

M16. The method according to any of the two preceding device embodiments wherein the minimum effective thickness of the beam neighboring section is 1,500 μm.

M17. The method according to any of the two preceding device embodiments wherein the minimum effective thickness of the beam neighboring section is 2,000 μm.

M18. The method according to any of the two preceding device embodiments wherein the minimum effective thickness of the beam neighboring section is 2,500 μm.

M19. The method according to any of the two preceding device embodiments wherein the minimum effective thickness of the beam neighboring section is 3,000 μm.

M20. The method according to any of the two preceding device embodiments wherein the minimum effective thickness of the beam neighboring section is 5,000 μm.

M21. The method according to any of the two preceding method embodiments wherein the minimum effective thickness is configured to be used with a beam energy of at least 15 KeV.

M22. The method according to any of the three preceding method embodiments wherein the minimum effective thickness is configured to be used with a beam energy of at least 20 KeV.

M23. The method according to any of the four preceding method embodiments wherein the minimum effective thickness is configured to be used with a beam energy of at least 30 KeV.

M24. The method according to any of the five preceding method embodiments wherein the minimum effective thickness is configured to be used with a beam energy of at least 50 KeV.

M25. The method according to any of the six preceding method embodiments wherein the minimum effective thickness is configured to be used with a beam energy of at least 100 KeV.

M26. The method according to any of the seven preceding method embodiments wherein the minimum effective thickness is configured to be used with a beam energy of at least 150 KeV.

M27. The method according to any of the eight preceding method embodiments wherein the minimum effective thickness is configured to be used with a beam energy of at least 200 KeV.

M28. The method according to any of the nine preceding method embodiments wherein the minimum effective thickness is configured to be used with a beam energy of at least 300 KeV.

M29. The method according to any of the ten preceding method embodiments wherein the desired maximum absolute dimensional tolerance is based also on the beam energy.

M30. The method according to any of the preceding method embodiments wherein the beam facing surface is formed to have a maximum surface roughness of Ra 0.04 μm.

M31. The method according to any of the preceding method embodiments wherein the beam facing surface is formed to have a maximum surface roughness of Ra 0.03 μm.

M32. The method according to any of the preceding method embodiments wherein the beam facing surface is formed to have a maximum surface roughness of Ra 0.02 μm.

M33. The method according to any of the preceding method embodiments wherein the beam facing surface is formed to have a maximum surface roughness of Ra 0.01 μm.

M34. The method according to any of the preceding method embodiments wherein the beam facing surface is formed to have a maximum surface roughness of Ra 0.0075 μm.

M35. The method according to any of the preceding method embodiments wherein the beam facing surface is formed to have a maximum surface roughness of Ra 0.005 μm.

M36. The method according to any of the preceding method embodiments wherein the beam facing surface is formed to have a maximum absolute dimensional tolerance of 0.9 μm.

M37. The method according to any of the preceding method embodiments wherein the beam facing surface is formed to have a maximum absolute dimensional tolerance of 0.8 μm.

M38. The method according to any of the preceding method embodiments wherein the beam facing surface is formed to have a maximum absolute dimensional tolerance of 0.7 μm.

M39. The method according to any of the preceding method embodiments wherein the beam facing surface is formed to have a maximum absolute dimensional tolerance of 0.6 μm.

M40. The method according to any of the preceding method embodiments wherein the beam facing surface is formed to have a maximum absolute dimensional tolerance of 0.5 μm.

M41. The method according to any of the preceding method embodiments wherein the beam facing surface (302c) has a maximum absolute dimensional tolerance of 0.4 μm.

M42. The method according to any of the preceding method embodiments wherein the beam facing surface (302c) has a maximum absolute dimensional tolerance of 0.3 μm.

M43. The method according to any of the preceding method embodiments wherein the beam facing surface (302c) has a maximum absolute dimensional tolerance of 0.2 μm.

M44. The method according to any of the preceding method embodiments wherein the beam facing surface (302c) has a maximum absolute dimensional tolerance of 0.1 μm.

M45. The method according to any of the preceding method embodiments wherein the beam facing surface (302c) has a maximum absolute dimensional tolerance of 0.05 μm.

M46. The method according to any of the preceding method embodiments wherein the beam facing surface (302c) has a maximum absolute dimensional tolerance of 0.02 μm.

M47. The method according to any of the preceding method embodiments for forming an aberration corrector.

M48. The method according to any of the preceding method embodiments further comprising the step of providing a substrate for supporting the electrodes having electrically insulating properties.

D76. The method according to any of the preceding method embodiments wherein the substrate (306) comprises any of glass, Pyrex, and/or a conductive material covered with insulating material, such as silicon oxide.

M49. The method according to the preceding method embodiment wherein the substrate is formed to have a thickness of at least 100 μm.

M50. The method according to the preceding method embodiment wherein the substrate is formed to have a thickness of at least 500 μm.

M51. The method according to the preceding method embodiment wherein the substrate is formed to have a thickness of at least 1,000 μm.

M52. The method according to any of the two preceding method embodiments wherein the substrate is formed to have a thickness of at least 1,250 μm.

M53. The method according to any of the three preceding method embodiments wherein the substrate is formed to have a thickness of at least 1,500 μm.

M54. The method according to any of the four preceding method embodiments wherein the substrate is formed to have a thickness of at least 2,000 μm.

M55. The method according to any of the five preceding method embodiments wherein the substrate is formed to have a thickness of at least 2,500 μm.

M56. The method according to any of the six preceding method embodiments wherein the substrate is formed to have a thickness of at least 3,000 μm.

M57. The method according to any of the seven preceding method embodiments wherein the substrate is formed to have a thickness of at least 5,000 μm.

M58. The method according to any of the eight preceding method embodiments wherein the substrate is formed to be fixed to the electrode component and to have at least one substrate beam facing surface(s) flush with the beam facing surfaces.

M59. The method according to the preceding method embodiment wherein the electrode component and the substrate are formed to be fixed together by an intermediate layer.

M60. The method according to the preceding method embodiment wherein the electrode component and the substrate are formed to be fixed together by a wafer bond.

M61. The method according to the preceding method embodiment wherein the electrode component and the substrate are formed to be glued together.

M62. The method according to any of the preceding method embodiments wherein the electrode component is formed to have connectors formed to be connected with a voltage source.

M63. The method according to any of the preceding method embodiments wherein the electrode component is formed to have a multipole component with 2×N poles, with N being an integer.

M64. The method according to any of the preceding method embodiments further with the steps of forming at least one pathway for charged particle beams.

M65. The method according to any of the preceding method embodiments further with the steps of forming at least two pathways for charged particle beams.

M66. The method according to the preceding method embodiment wherein a quadrupole for each of the two charged particle beams is formed.

M67. The method according to the preceding method embodiment wherein the two quadrupoles are formed to share a common electrode.

M68. The method according to any of the preceding method embodiments wherein electrode components is formed to have at least two indexing markers (408) in order to align the electrode component with any other component, such as the substrate.

M69. The method according to any of the two preceding method components wherein the indexing markers (408) are formed to comprise four micro holes in at least one of the components, such as the electrode component.

M70. The method according to any of the three preceding method embodiments wherein the alignment tolerances are formed to have at most 1 µm in any lateral or axial orientation.

M71. The method according to any of the four the preceding method embodiment wherein the alignment tolerances in any lateral or axial orientation are formed to amount at most 1 µm.

M72. The method according to any of the five preceding method embodiments wherein the alignment tolerances in any angular orientation of the components in plane orientation are formed to amount to at most 5 mrad.

M73. The method according to any of the six preceding method embodiments wherein the alignment tolerances in any tilting orientation of the components are formed to be oriented to each other with at most 1 mrad.

M74. The method according to any of the preceding method embodiments applying a high-precision forming process for forming at least the electrode component (300).

M75. The method according to any of the preceding method embodiments applying a high-precision forming process when forming at least the beam neighboring section, such as lithography, reactive ion etching (RIE), deep reactive ion etching (DRIE), deep dry etching, wet etching, silicon oxide, oxide, wafer bonding, silicon wafer forming and/or material depositing.

M76. The method according to any of the preceding method embodiments with forming at least the beam neighboring section from conductive Si-wafer material and/or semiconductor Si-wafer with a metal coating.

M77. The method according to any of the preceding method embodiments wherein the method further comprises determining the desired maximum absolute dimensional tolerance.

M78. The method according to the preceding method embodiment wherein the method further comprises selecting a high-precision forming process based on the desired maximum absolute dimensional tolerance.

Below is a list of Operation embodiments. Those will be indicated with a letter "O". Whenever such embodiments are referred to, this will be done by referring to "O" embodiments.

O1. Operation of a charged particle beam microscope with a device according to any of the preceding device embodiments and generating a beam energy of more than 10 KeV, preferably more than 15 KeV, more preferably more than 20 KeV, more preferable more than 30 KeV, more preferably more than 50 KeV, more preferably more than 100 KeV, more preferably more than 200 KeV and even more preferably more than 300 KeV.

O2. Operation of a charged particle beam lithography apparatus with a device according to any of the preceding device embodiments and generating a beam energy of more than 10 KeV, preferably more than 15 KeV, more preferably more than 20 KeV, more preferable more than 30 KeV, more preferably more than 50 KeV, more preferably more than 100 KeV, more preferably more than 200 KeV and even more preferably more than 300 KeV.

Below is a list of use embodiments. Those will be indicated with a letter "U". Whenever such embodiments are referred to, this will be done by referring to "U" embodiments.

U1. Use of the device according to any of the preceding device embodiments in a charged particle system.

U2. Use of the device according to any of the preceding device embodiments as an aberration corrector in a charged particle system.

U3. Use of the device according to any of the preceding device embodiments as an aberration corrector in a charged particle system wherein a plurality of devices are arranged in a stack.

U4. Use of the device according to any of the preceding device embodiments in a charged particle microscope.

U5. Use of the device according to any of the preceding device embodiments in a charged particle lithography system.

BRIEF DESCRIPTION OF THE DRAWINGS

Further potential and thus non-limiting features, details and advantages of the invention will be discussed in the following drawings.

FIG. 10 shows an electrode component and a stacked one with two electrodes stacked.

DETAILED DESCRIPTION

For the sake of clarity, some features may only be shown in some figures, and others may be omitted. However, also the omitted features may be present, and the depicted and discussed features do not need to be present in all embodiments. Further, in the following, embodiments of the present invention will be described with an aberration corrector or device being used as a non-limiting example of an active charged particle optics device or component.

Figure 1:
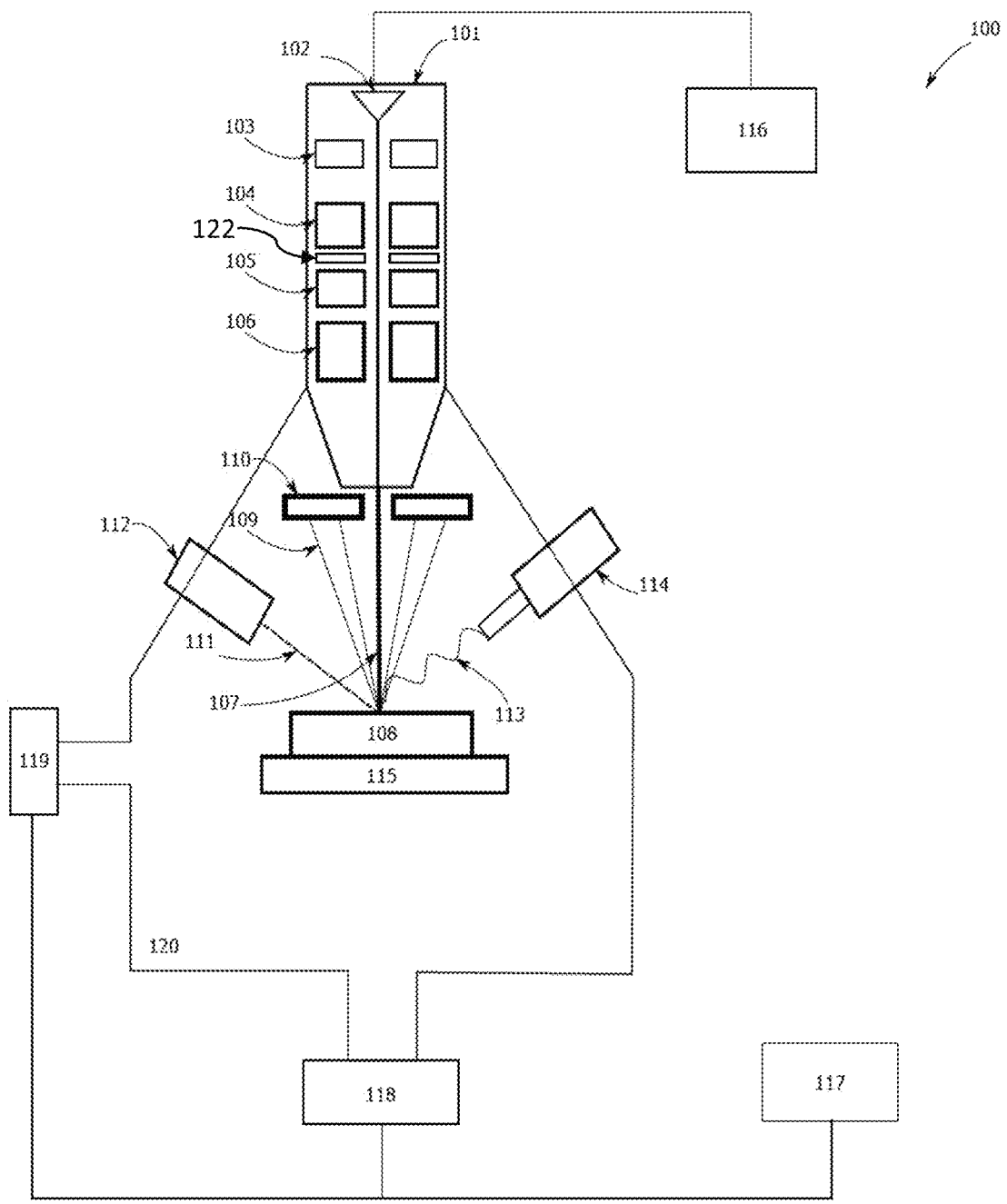
FIG. 1 depicts a microscopy system comprising an active charged particle optics component.

FIG. 1 shows components of a scanning microscopy system 100. The scanning microscopy system 100 may be configured for generating a primary beam 107 of charged particles (e.g., electrons or ions). The scanning microscopy system 100 may be further configured to direct the primary beam 107 of charged particles on to a sample 108. The scanning microscopy system 100 may comprise, for example, a Scanning/Transmission Electron Microscope (SEM/TEM) 101.

In this example, the primary beam comprises an electron beam 107. The electron beam 107 may be generated by an electron source 102 configured for emitting the electron beam, wherein a voltage may be applied between the electron source 102 and an anode 103. The applied voltage may preferably range from at least 0.1 kV to 30 kV. The scanning microscopy system 100 may further comprise a directing and/or focusing assembly that may comprise, for example, electromagnetic lenses. The electromagnetic lenses may be configured for controlling the path of the electron beam 107. At least one condensing lens 104 may be comprised by the electromagnetic lenses. The condensing lens 104 may be configured for controlling the size of the beam 107. Moreover, at least one objective lens 106 may be comprised by the electromagnetic lenses. The objective lens 106 may be configured for focusing the electron beam 107 to a scan point on the sample 108. The scan point may correspond to an electron spot on the sample 108. Further, the dimensions and the shape of the scan point may depend on the focusing properties of the electromagnetic lenses (e.g., applied current) and the working distance between the SEM 101 and the sample 108. A scanning device 105 may be configured for deflecting the ion beam 107 over a plurality of scan locations in one or two dimensions. Thus, as an optional advantage, this may enable a two-dimensional scanning of the sample. The scanning device 105 may be magnetic and/or electrostatic. An aberration corrector 122 may be located between the condensing lens 104 and the scanning device 105 and may be configured for compensation and/or correcting aberrations of the microscopy system 100.

The scanning microscopy system 100 may be configured for detecting first and second emissions 109, 111, 113. The electron beam 107 may interact with particles (such as atoms) of the sample 108. This interaction may result in the first and second emissions. The first emissions may comprise emissions of charged particles, such as secondary electrons and/or secondary ions. The first emissions may also comprise emissions of backscattered, transmitted and/or Auger electrons. Further, the second emissions may comprise emissions of photons across a range of wavelengths, such as X-rays and/or light (e.g., visible light).

In the example of FIG. 1, the scanning microscopy system 100 may comprise a first detector 110, wherein the first detector 110 may be configured for detecting backscattered electrons 109 emitted from the scan locations in a sequential manner. Thus, the first detector 110 may comprise a backscattered electron detector, such as a segmented silicon drift detector. However, the backscattered electron detector may also correspond to other types of solid-state detectors. Moreover, the scanning microscopy system 100 may comprise a second detector 112, wherein the second detector 112 may be configured for detecting secondary electrons and/or secondary ions 111 emitted from the scan locations in a sequential manner. Thus, the second detector may comprise a secondary electron detector, such as an Everhart-Thornley detector. The second detector may alternatively or additionally comprise a secondary ion detector, such as a charged particle multiplier.

Further, the scanning microscopy system may comprise a third detector 114, wherein the third detector 114 may be configured for detecting photons emitted from the scan locations in a sequential manner. Thus, the third detector 114 may comprise, for example, an X-ray detector, wherein the X-ray detector may comprise, for example, a silicon drift detector. However, the third detector 114 may also comprise other types of photon detectors (e.g. scintillation detectors). The second and the third detector 112, 114 may be tilted with respect to the surface of the sample 108.

The third detector 114 may be comprised by an energy-dispersive spectrometer (EDS). The energy bandwidth of the EDS may range from 0 to 17 KeV. In another modality the third detector 114 may be comprised by a wavelength-dispersive spectrometer (WDS). Further, the third detector 114 may also be comprised by an electron energy loss spectrometer or a cathodoluminescence spectrometer.

The sample 108 may be positioned on top of a movable stage 115. The movable stage 115 may be configured for performing two horizontal movements, a vertical movement, a tilting movement, and/or a rotational movement, with respect to the plane of the sample 108. The two horizontal movements may comprise selecting a field of view. The vertical movement may comprise changing the height of the sample 108 and thus the depth of focus and/or the image resolution.

The scanning microscopy system 100 may further comprise a control unit 116. The control unit 116 may be configured for controlling the power supply and operation of the condensing lens 104, the objective lens 106, the scanning coil 105 and the movable stage 115. Further, the scanning microscopy system 100 may comprise a vacuum system. The vacuum system may comprise a vacuum controller 117, a mechanical pumping system 118, an ultra-high vacuum pump 119 (such as an ion pump) and a vacuum chamber 120. The vacuum controller 117 may be configured for controlling the operation of the mechanical pumping system 118 and the ultra-high vacuum pump 119. The mechanical pumping system 118 and the ultra-high vacuum pump 119 may be configured for providing an ultra-high vacuum within the vacuum chamber 120. The vacuum chamber 120 may be configured for housing the sample 108, the movable stage 115, the first detector 110 or parts thereof, the second detector 112 or parts thereof, the third detector 114 or parts thereof, and the SEM 101 or parts thereof.

A relevant consideration for the achievable resolution of the microscopy system 100 may be the energy, more particularly a central energy, of the electron beam 107. Higher energies may lead to shorter wavelengths thus improving the resolution of the microscopy system 100. However, higher energy of the electron beam 107 would also drive up the magnitude of the electrostatic field needed in any of the active charged particle optics components, such as the aberration corrector 122, to have an effect on the beam 107. An exemplary active charged particle optics component 200, that may be, for example, an electrostatic deflector, is depicted in FIG. 2.

A respective lithography system working similar to the microscope shown is also enclosed by the present invention.

Figure 2A:
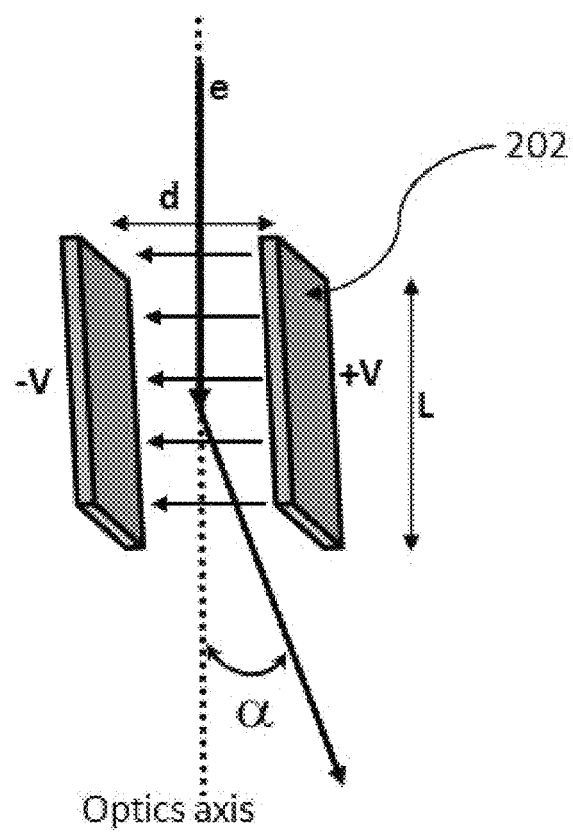
FIG. 2*a* depicts a heuristic schematic of an active charged particle optics component.
Figure 2B:
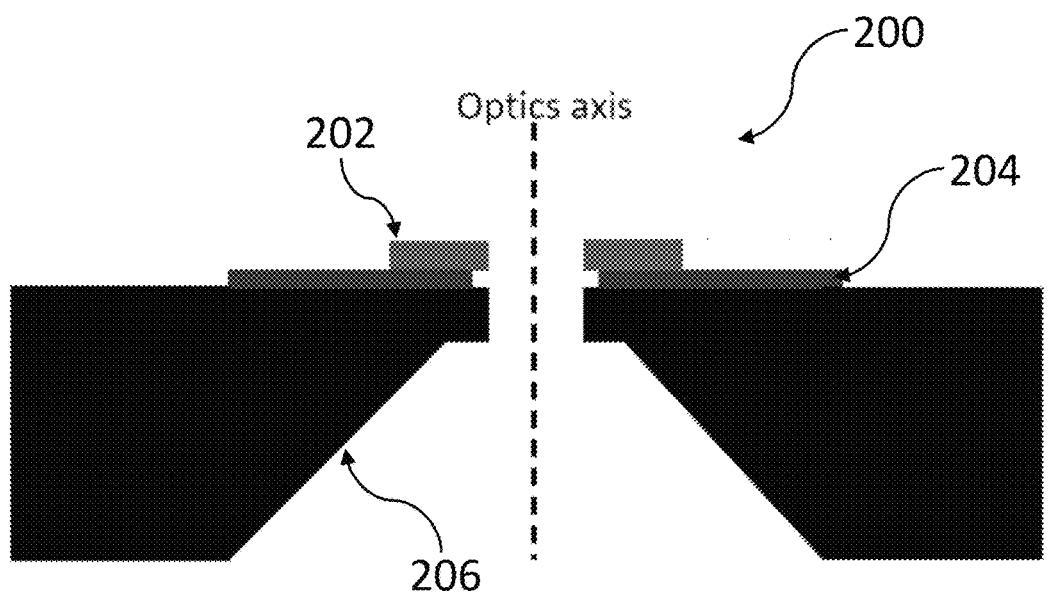
FIG. 2*b* depicts a schematic setup of the active charged particle optics component.

FIG. 2 depicts the active charged particle optics device or component 200 that may be used to deflect the electron beam 107 by an angle \alpha. FIG. 2a depicts a heuristic schematic of the active charged particle optics component 200, whereas FIG. 2b depicts a schematic diagram of the active charged particle optics component 200 as may be employed in the microscopy system 100 or a lithography system.

As depicted in FIG. 2a, the active charged particle optics component 200 may comprise a pair of electrodes 202 serving as a cathode and an anode. An equal, but opposite voltage, U, may be applied to the cathode (negative) and anode (positive or ground). The resultant electric field, E_x, may be used to deflect an electron beam traveling along optics axis or in the z-direction by the angle \alpha, see also FIG. 1. The electrodes may be placed a distance, d, apart and may each have a thickness, L along the direction of motion of the electron beam 107. FIG. 2b depicts an exemplary realization of the active charged particle optics component 200. The electrodes 202 may be fabricated as films on top of a separating layer 204, that may be further supported by a membrane 206. The thickness of the electrodes 202 may be similar to the thickness of the separating layer 204 and may be, for example, 10 µm, while the thickness of the membrane 206 may be 500 µm. The distance, d, may be, for example, 10 µm.

While the active charged particle optics component 200 with electrodes 202 of a thickness as described above may be employed in the microscopy system 100 for deflecting the electron beam 107 with a central energy less than, for example, 10 KeV, the component 200 may not be employed for an electron beam 107 of higher central energy. This is because the angle \alpha may be determined as \alpha= (E_x·L)/(2 E), where E is proportional to the central energy of the electron beam 107. Thus, the larger the thickness, L, of the electrodes 202, the longer is the electron beam 107 acted upon by the active charged particle optics component 200, and the larger is the deflection angle \alpha. However, as may be appreciated from this relation, for the same thickness, L, and same voltage U (and thus E_x) applied to the electrodes 202, a higher central energy of the electron beam 107 is deflected less. In particular, the deflection angle is inversely related to the central energy of the beam 107. Thus, if the resolution of the microscopy system 100 is to be increased by increasing the energy of the electron beam 107, either a stronger electrostatic field, E_x, may have to be generated inside the active charged particle optics component 200, or the thickness, L, of the electrodes 200 may have to increased. The strength of the electrostatic field, E_x, may be limited due to its effect on the electron beam 107 but also due to limitations of arcing issues (10 KV/mm in vacuum and 1 KV/mm along the surface creepage of an insulator). A relevant consideration here may be the desired aspect ratio of the active charged particle optics component 200. For example, if a component similar to the component 200 depicted in FIG. 2 is to be used with an electron beam 107 with a central energy of 300 KeV, the aspect ratio of the electrodes 202 has to be increased by a factor of 30. Such an aspect ratio may be difficult to achieve with conventional fabrication techniques as described earlier.

Figure 3:
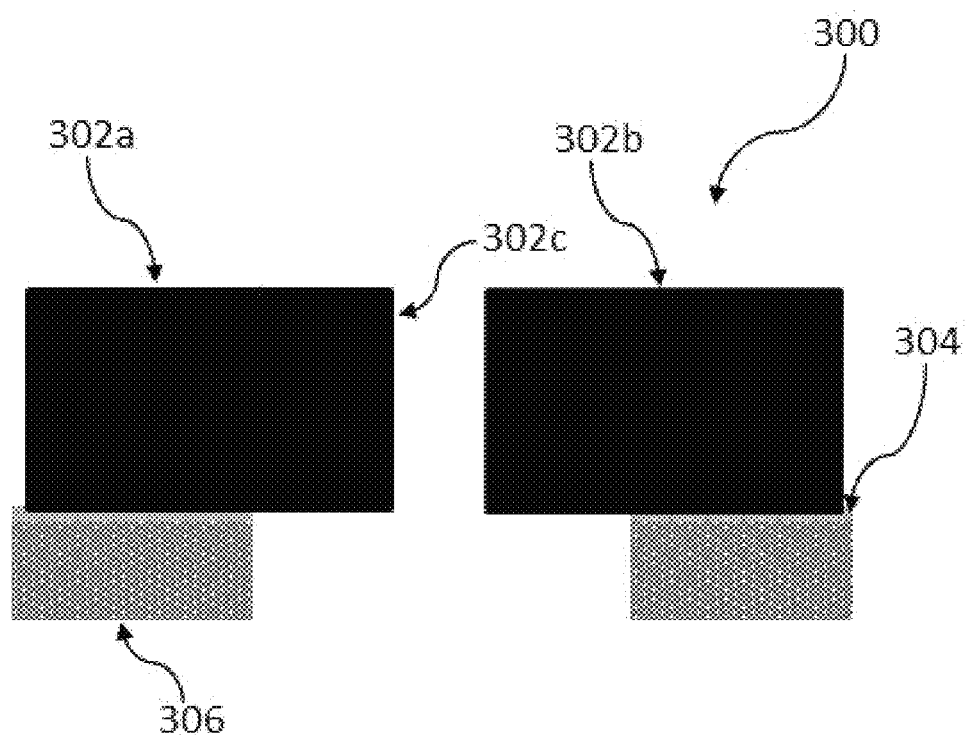
FIG. 3 depicts an exemplary active charged particle optics component according to the present invention.

According to FIG. 3, embodiments of the present invention relate to active charged particle optics components 300 with electrodes 302 that may be used in a microscopy system for beams with a high central energy of the particles. They may be of particular advantage for charged particle beam microscopy systems where the central energy of the charged particle beam is more than 10 KeV, preferably at least 15 KeV, further preferably at least 20 KeV and even considerably more. Such active charged particle optics components 300 may be created by precision manufacturing of the electrodes 302. For example, the charged particle optics component 300 may comprise at least two electrodes 302a and 302b, with a high-precision microstructure and a minimum thickness of 1 mm, preferably 1.5 mm, and further preferably 2 mm and even more. The thickness is along the inner surface 302c of the beam neighboring section of the electrode(s). Embodiments of the present invention may also be directed to fabrication of more complex active charged particle optics components 300, comprising 2×N electrodes 302, where the component 300 may be used to generate an electrostatic field of N-polarity, such as 4 electrodes for generating a quadrupole electrostatic field.

FIG. 3 depicts an exemplary embodiment of an active charged particle optics component 300 according to the present invention. The component 300 comprises a pair of electrodes 302, assembled on a separating layer 304, which are then supported on a substrate or membrane 306.

The electrodes 302 may comprise any conducting and/or semi-conducting material, such as silicon wafer material or even an insulator covered with a conductive layer. The separating layer 304 may comprise any material that may insulate the electrodes 302 from the underlying membrane 306. So, for example, when the electrodes 302 comprise a metal, the separating layer 304 may comprise adhesive or glue. The substrate 306 may also comprise an electrical conductor or insulator. When an electrical conductor is used, care may be taken that there is no possibility of shorting between the membrane 306 and the electrode 302. For example, the membrane 306 may comprise glass, Pyrex and/or silica ($SiO_2$).

Figure 4A:
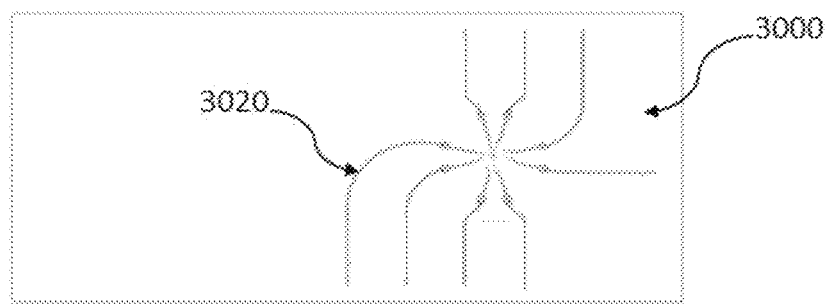
FIG. 4*a* depicts a step in a fabrication of the active charged particle optics component according to the present invention.
Figure 4B:
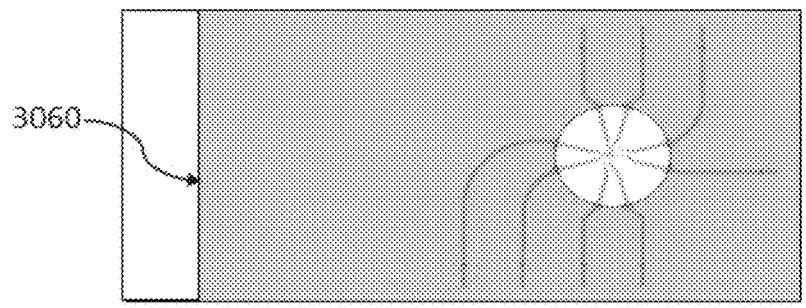
FIG. 4*b* depicts another step in the fabrication of the active charged particle optics component according to the present invention.

The exemplary active charged particle optics component 3000 may be fabricated by employing a sequence of suitable techniques. This is depicted in FIG. 4. For example, when the electrodes 302 comprise silicon, a suitable fabrication technique may comprise etching away a block of bulk silicon so as to produce a groove in the bulk silicon. The etching technique may comprise, for example, a deep reactive ion-etching technique. A width of the groove may be chosen to correspond to the desired separation, such as 10 μm or even smaller, between the electrodes 302. An advantage of using etching may be that the process may be precisely controlled. For example, the depth of the groove may be controlled by controlling the etching time and/or the etching rate (that may be known based on the etchant used). Further, the width of the groove may be controlled by choosing the etchant appropriately. If a crystalline material is used for the electrodes 302, for example, the etchant may be chosen such that the rate of etching depends on the crystal face that is exposed. A suitable choice of etchant may be such that the rate of etching is fastest in the vertical direction. A further advantage of employing an etching process may be that a surface roughness of the fabricated microstructures may be significantly low. For example, a maximum surface roughness of Ra 0.05 μm may be obtained. Thus, the cavity or the surfaces between the electrodes 302 may be precisely shaped. This step is depicted in FIG. 4a, where grooves along the line 3020 are etched into bulk silicon 3000.

Note that the bulk silicon 3000 may not be etched right through so as to produce disjoint silicon electrodes 302 yet, so as to not adversely affect the spacing between the electrodes 302 that are fabricated. Rather, in a further step, depicted in FIG. 4b, the bulk silicon 3000 with the grooves may be glued on to a substrate/membrane 3060 such as glass, Pyrex, or a silicon wafer covered with an insulator (such as silica). This may help provide stability to the bulk silicon 3000 without affecting the width of the grooves 3020 (and thus the separation between the electrodes 302). The width of the separation between etched Si electrodes is getting larger when moving away from a center of active elements. This is because, at the center, the electrodes are floating in vacuum and a breakdown voltage threshold is 10 KV/mm, so the distances could be kept smaller but at the outside, when electrodes are resting on an insulator, the breakdown threshold is governed by the surface creepage distance on the insulator (which is effectively, the distance between the electrodes). Thus, it can be advantageous to make this distance larger and to not necessarily form straight lines. Any other shape can be used as well. These separations could be uses for gluing the electrodes to the insulator.

Figure 4C:
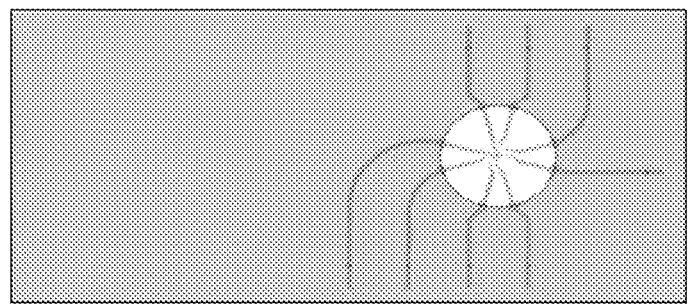
FIG. 4*c* depicts yet another step in the fabrication of the active charged particle optics component according to the present invention.
Figure 4D:
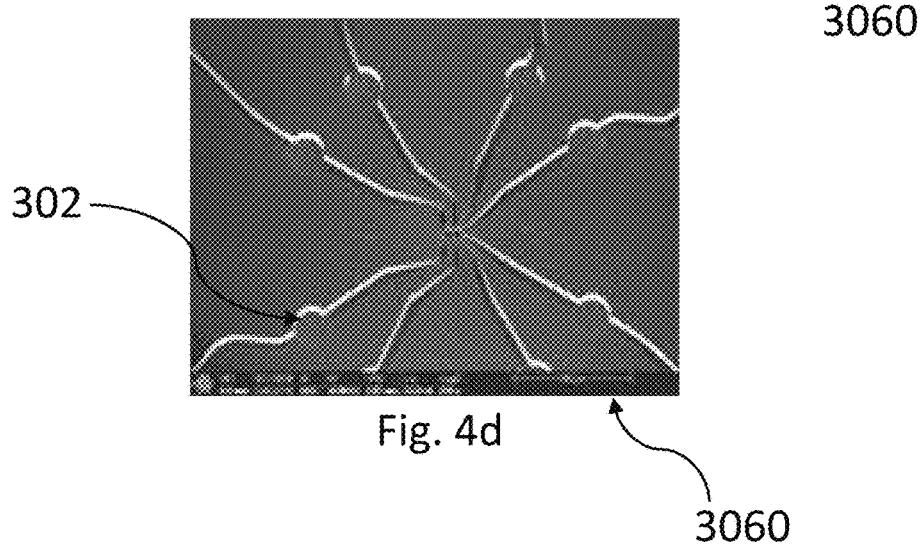
FIG. 4*d* depicts the final active charged particle optics component according to the present invention.

Once the bulk silicon 3000 has thus been glued on to the substrate 3060, the electrodes 302 may be separated by dicing along the grooves 3020, as depicted in FIG. 4c. Any trailing edges of the bulk silicon 3000 may also be diced away. The final charged particle optics component 300 is depicted in FIG. 4d. Dicing may be accomplished by means of a laser, or any other suitable means of dicing.

Figure 5A:
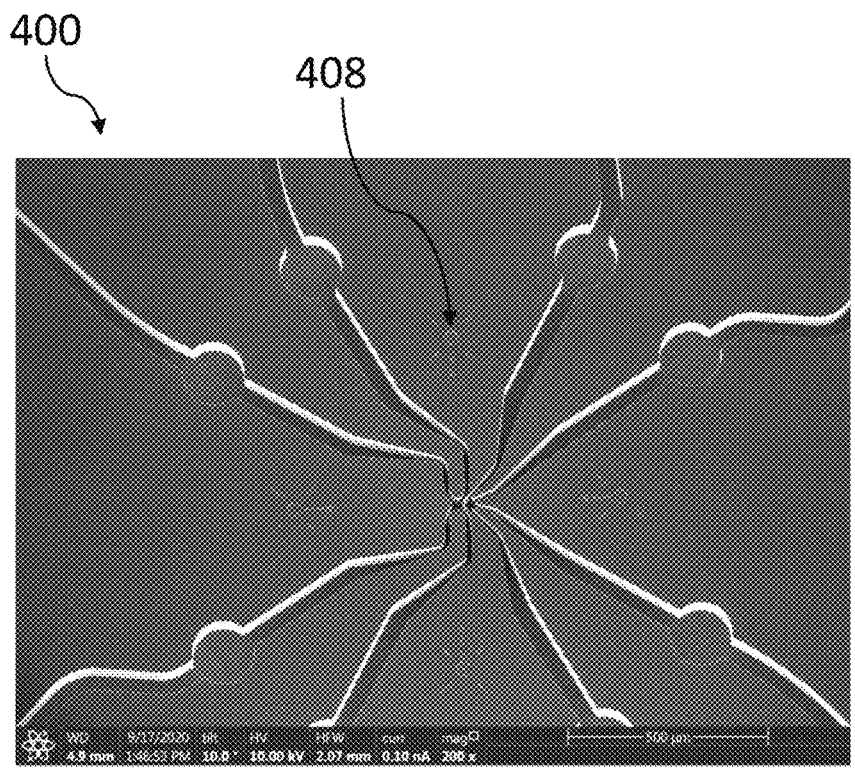
FIG. 5a depicts an image of the active charged particle optics component according to the present invention.
Figure 5B:
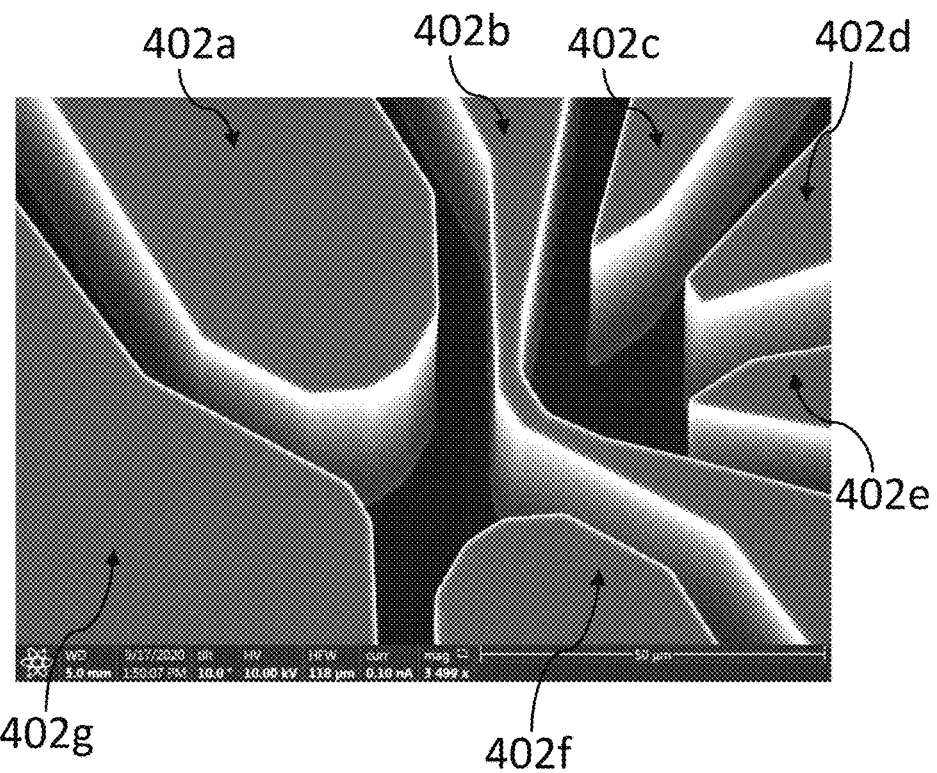
FIG. 5b depicts a zoomed-in image of the active charged particle optics component according to the present invention.

FIG. 5 depicts an image of an exemplary charged particle optics component 400 fabricated in a lab. FIG. 5a depicts a zoomed-out view of the component 400, while FIG. 5b depicts a zoomed-in view. The charged particle optics component 400 comprises 7 electrodes 402 (a through g). The 7 electrodes 402 may be used to generate two adjacent quadrupole electrostatic fields, for example. In this case the two sets of quadrupoles share one electrode, as can be seen.

Further, the component 400 comprises alignment markers 408 that may be used for aligning the charged particle optics component 400 in the microscopy system 100. These alignment markers 408 may be patterned on the electrodes 402 or on an underlying substrate 406 (not shown) thereof, using any suitable lithography technique.

Figure 6A:
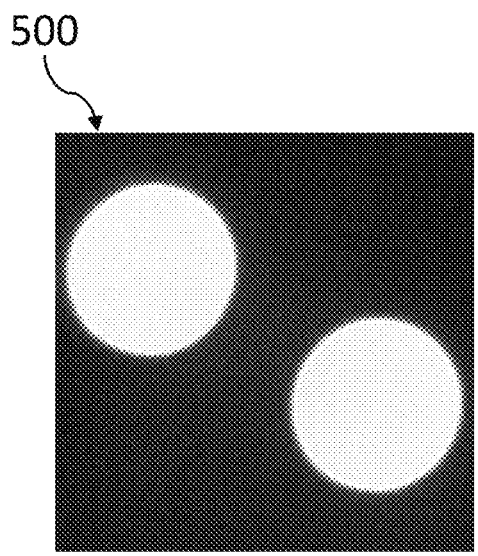
FIG. 6a depicts an image of the active charged particle optics component according to the present invention for a beam energy of 60 KeV.
Figure 6B:
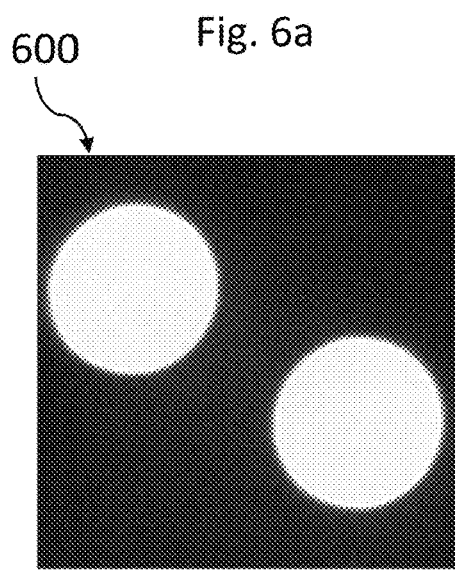
FIG. 6b depicts an image of the active charged particle optics component according to the present invention for a beam energy of 300 KeV.

FIG. 6a depicts an active charged particle optics component 500 fabricated as described above for use in a microscopy system 100 comprising an electron beam 107 with a beam energy of up to 60 KeV. FIG. 6b depicts another active charged particle optics component 600, comprising five times thicker electrodes, fabricated as described above for use in a microscopy system 100 comprising an electron beam 107 with a beam energy of up to 300 KeV. Comparing FIGS. 6a and 6b, it may be appreciated that even though the thickness of the electrodes is increased by a factor of 5, the precision of the apertures (that may correspond to the separation, d, between the electrodes 202 in FIG. 2) is similar. Thus, the present invention may allow fabrication of active charged particle optics components for use with beams 107 of energies significantly larger than 10 KeV.

Figure 6C:
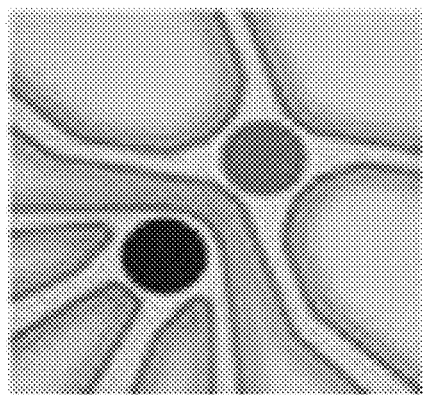
FIG. 6c depicts a micro structure comprising a recess through the component with the electrodes enclosing a circular or cylindrical structure according to the invention. present invention.

FIG. 6c shows how electrodes can circumscribe a circular structure with respect to the embodiment shown in FIG. 5. This can be formed by a cross-section of a hypothetical cylinder, as a circle, in order to define a free space for a beam to pass the electrodes. In this manner two pathways, each for one charged particle beam, can be formed very efficiently.

Figure 7:
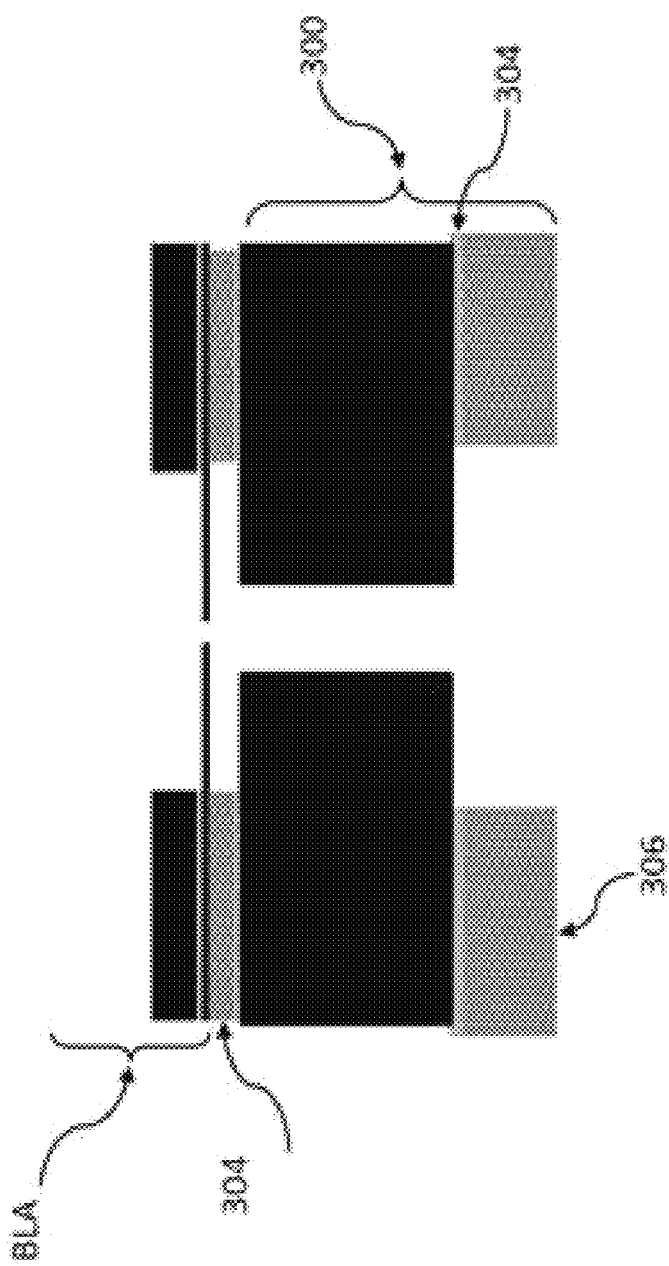
FIG. 7 shows a preferred device and a way of fabrication according to the present invention.

FIG. 7 exemplifies a preferred device and its principal way of fabrication according to the present invention. In particular, an electrode component or electrode assembly 302 can be arranged at the bottom for fabrication purposes. In the example shown, it is a quadrupole assembly. On top is an aperture plate or substrate 306 that has a larger aperture than is shown in FIG. 3. This is advantageous as the charged particles beam not to influenced by the substrate. A BLA (beam limiting aperture) can be arranged on top of element 300. This can be realized in order to prevent direct interaction of the charged particle beam with the electrodes.

Figure 8A:
FIG. 8a shows a preferred first step of fabrication of an aperture plate in accordance with the present invention.
Figure 8B:
FIG. 8b shows a preferred second step of fabrication of an aperture plate in accordance with the present invention.
Figure 8C:
FIG. 8c shows a preferred third step of fabrication of an aperture plate in accordance with the present invention.

The process of making the BLA is depicted in FIGS. 8a-8c.

FIG. 8a shows in more detail an aperture plate or supporting structure and its preferred first step of fabrication. A wafer structure or any other material is treated to form the apertures that are aligned with electrodes in the later-described electrode component. In the example shown, the electrodes are formed by a lithography and then an etching step. The lithography can be a high-resolution lithography step, such as an EBPG lithography step. The etching can be done by a highly anisotropic (dry) deep reactive ion etching (DRIE) process.

In FIG. 8b the aperture is formed by another lithography step, such as by NUV lithography, followed by another etching, such as the DRIE etching, mentioned before.

The intermediate material is further removed, as shown in FIG. 8c. The techniques for that can be a stripping of the insulating Si oxide and a metallization of the remaining structure.

Figure 8D:
FIG. 8d shows a preferred fourth step of fabrication of an aperture plate in accordance with the present invention.
Figure 8E:
FIG. 8e shows a preferred fifth step of fabrication of an aperture plate in accordance with the present invention.

In accordance with FIG. 8d an insulator that can comprise or consist of glass can be attached and then the final structure can be obtained by dicing and cleaning according to FIG. 8e.

Alternatively or additionally, a standard (thin=thickness<1 mm) Si-Wafer can be established and in order to increase the effective thickness the first steps, such as shown in FIGS. 8a-8c, can be repeated. E.g., as many thin wafers as possible can be created and then attached together with glue or wafer bonding etc. Then the steps according to FIGS. 8d and 8e can be continued. Also an SOI wafer could be chosen.

Electrical connections, such as the ones to electrodes 302a and 302b, can be formed by accommodating electrical connections in the layer 304.

Figure 9A:
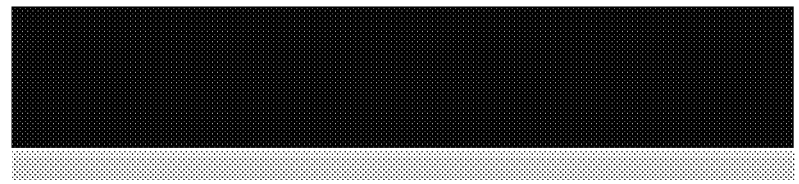
FIG. 9a shows a preferred first step of fabrication of an electrode component in accordance with the present invention.
Figure 9B:
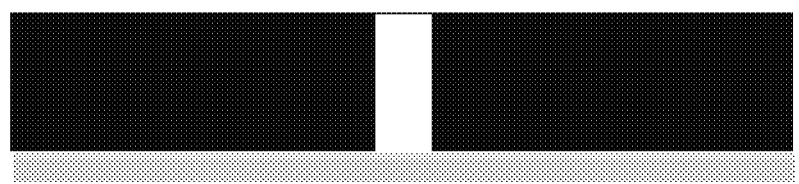
FIG. 9b shows a preferred second step of fabrication of an electrode component in accordance with the present invention.
Figure 9C:
FIG. 9c shows a preferred third step of fabrication of an electrode component in accordance with the present invention.
Figure 9D:
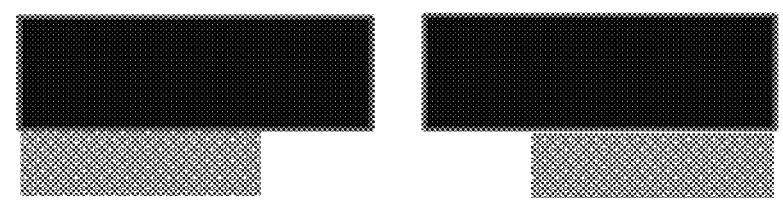
FIG. 9d shows a preferred fourth step of fabrication of an electrode component in accordance with the present invention.
Figure 9E:
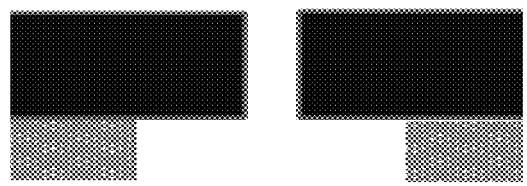
FIG. 9e shows a preferred fifth step of fabrication of an electrode component in accordance with the present invention.

The electrode component or assembly and a possible fabrication is further exemplified by FIGS. 9a-9e. As is apparent from FIG. 9a, oxide can be formed on bare Si by a PECVD process. This is an example only. Next, according to FIG. 9b, a lithographic step, such as an EBPG step and a DRIE step, can be chosen to form the electrode structure, such as a quadrupole, with optional alignment patterns. With a lithographic step, such as a NUV lithography, considerable material can be removed, followed by a DRIE etching or other etching steps. The Si oxide can be removed by another etching, followed by a metallization, see FIG. 9c. According to FIG. 9d, a spacer can be added. FIG. 9e exemplifies the dicing and further cleaning of the electrode component or quadrupole assembly.

Practically, this can be challenging as etching such a thick wafer has never been done so far. It is referred to FIG. 10. It has recently been found with respect to the present invention that for aberration corrector applications, it is possible to use an alternative solution to a very thick electrodes and that to split the electrodes 302a and 302b into a sandwich of two thin electrodes with a drift space in between such that the effective thickness of 302c in FIG. 1 is equal to the length L of the outer dimensions of the two layers of electrodes with the gap (or insulating material) in-between. This is especially of interest for multipoles, such as hexapoles to be used for hexapole based correctors but also in general for other multipoles. In practice, making these two elements can be very similar to making thick element 300 but then there will further steps of alignments be useful, see FIGS. 4 and 5.

Figure 11:
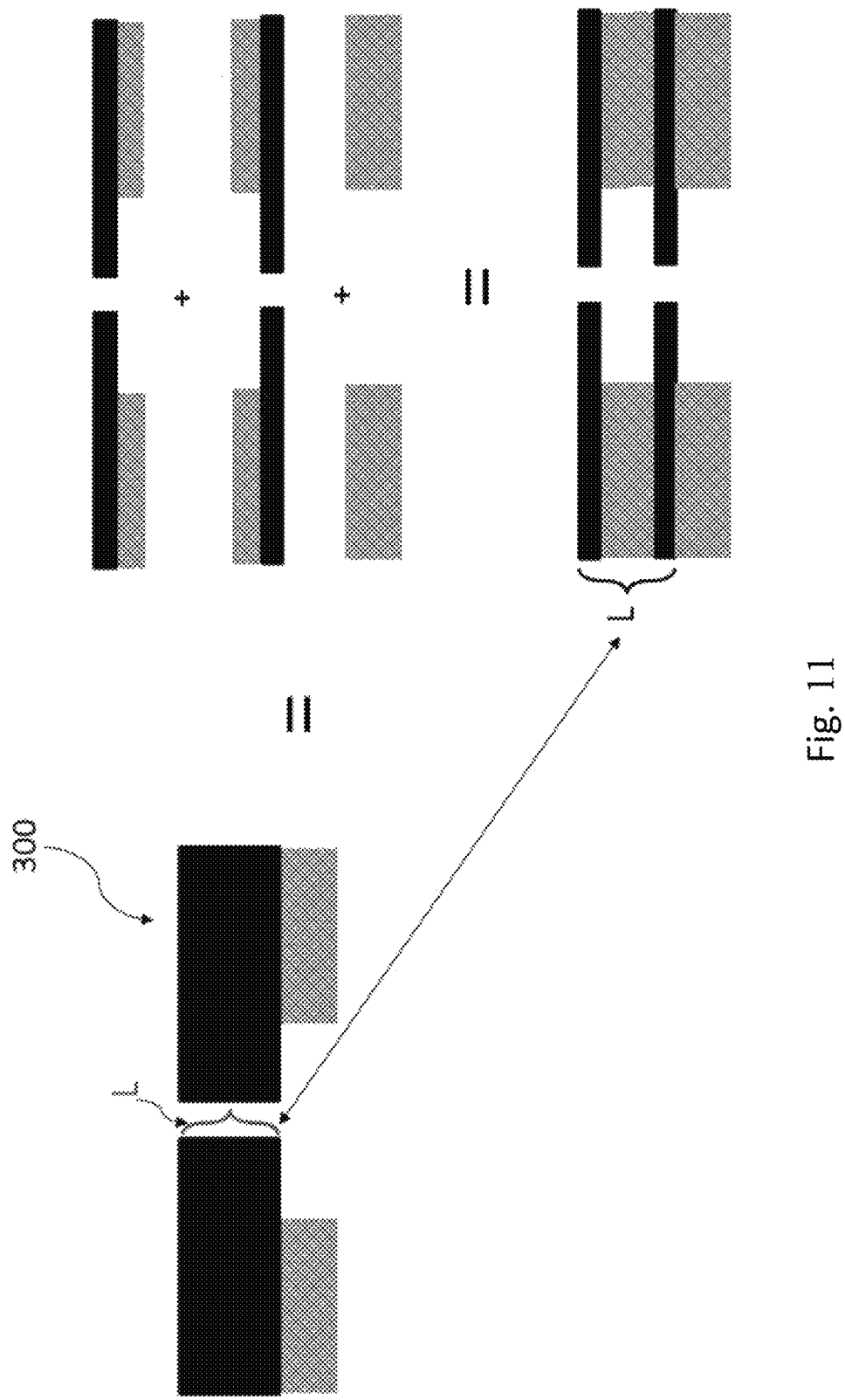
FIG. 11 shows an electrode component and a stacked one with two electrodes stacked and a preferred spacer in-between the two electrodes.
Figure 12:
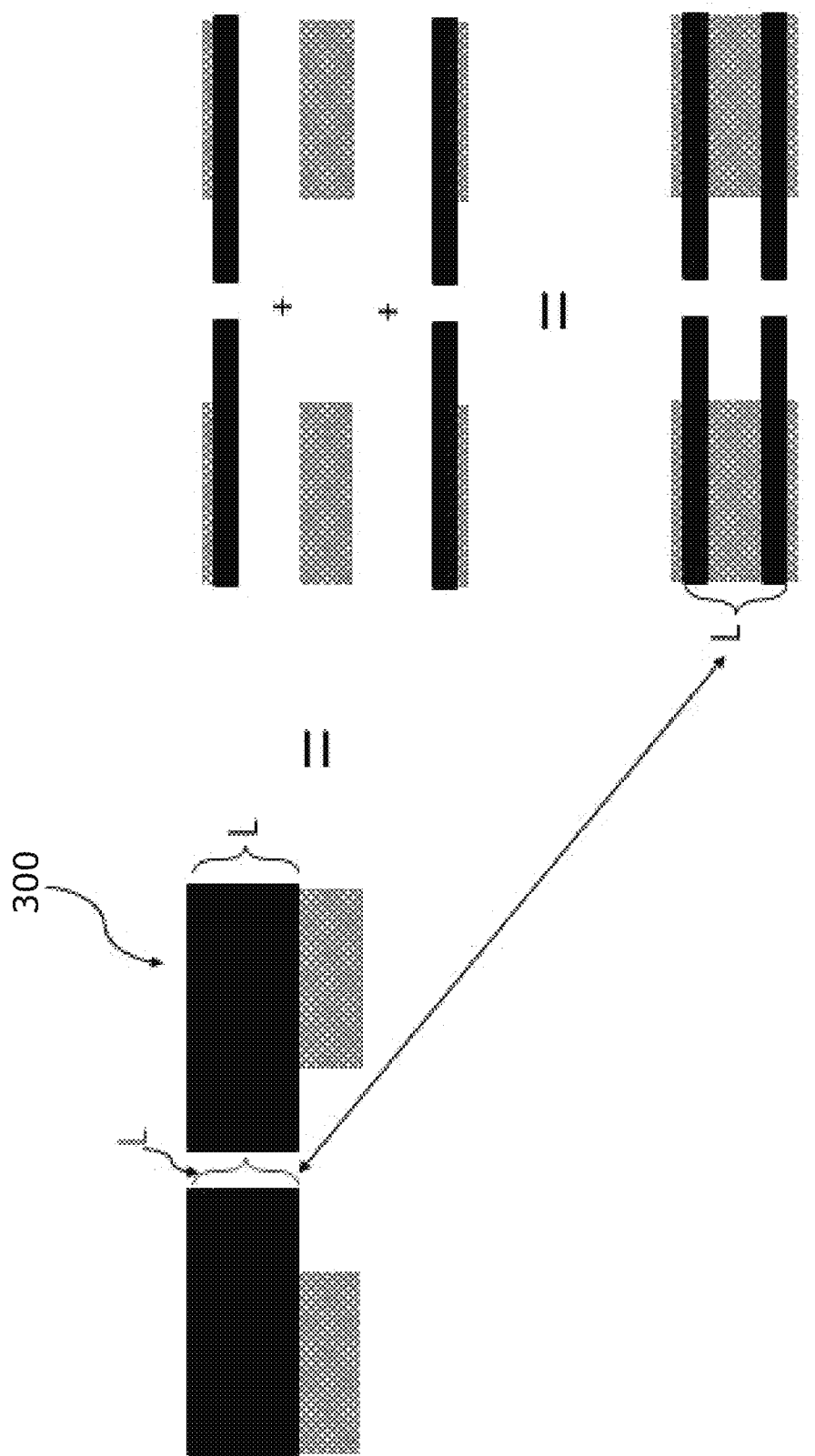
FIG. 12 shows another embodiment in accordance with the present invention comprising stacked multipoles.

Alternative arrangements are also schematically depicted in FIGS. 11 and 12. The electrodes form a thickness L with different arrangements of spacers or insulators, depending on the needs. The thickness L establishes the effective thickness.

Figure 13:
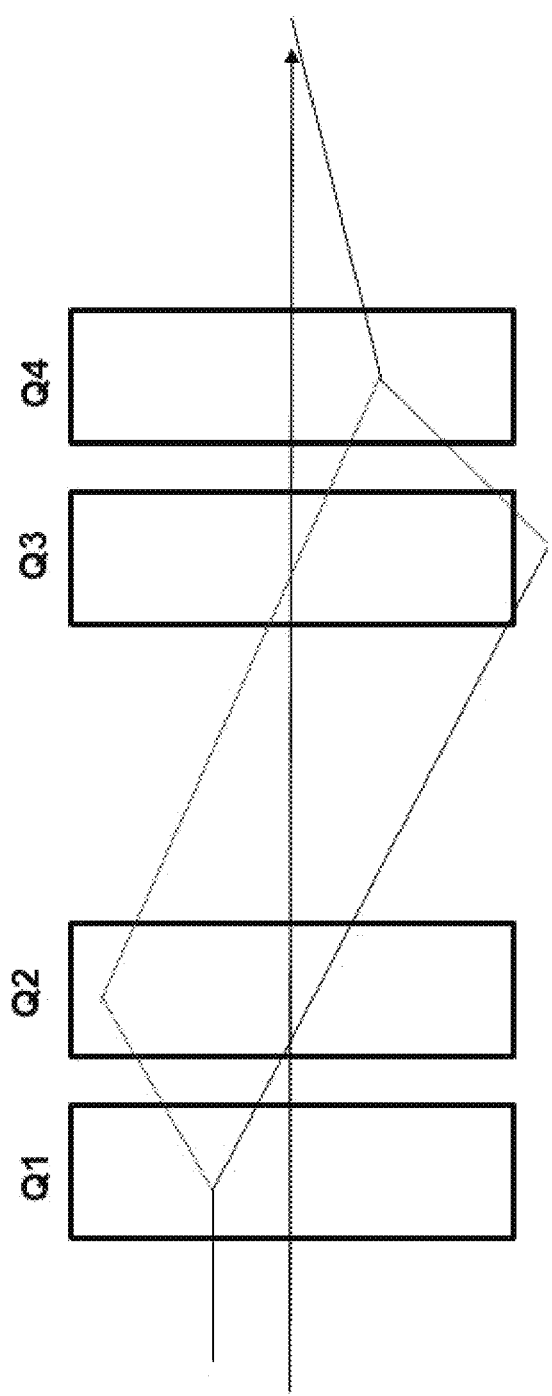
FIG. 13 shows an example of an aberration corrector, such as "Russian Quadruplet".

FIG. 13 is exemplifying a known corrector concept based on four quadrupoles (e.g., four multipoles, also known as a "Russian Quadruplet"). In such a sample an alignment of at least 1 µm accuracy between the individual elements is advantageous (between Q1, Q, . . . ). Thus, the fabrication accuracy isn't only needed to make individual electrodes but also needed to align the stack with the assistance of alignment marker between different elements (different Q in above example).

Note that at least one step of the fabrication method for the electrode component (300) may be chosen based on a desired maximum absolute dimensional tolerance. The desired maximum absolute dimensional tolerance may be based on characteristics of a charged particle system comprising the device as described above. For example, it may be based on the beam energy of the beam as described above. The desired maximum absolute dimensional tolerance may be based on a maximum voltage to be applied to any of the at least two electrodes (302a, b). The desired maximum absolute dimensional tolerance may be based on the effective length of any of the at least two electrodes (302a, b). The desired maximum absolute dimensional tolerance may be based on an aberration coefficient of a lens of the charged particle system. Thus, generally, the desired maximum absolute dimensional tolerance may be determined, and based thereon, at least one step of the fabrication method may be chosen. For example, one may consider an electrostatic multipole element with a radius of R and effective length L that produces a hexapole field (disregarding the fringe field), see FIGS. 14(a, b) and FIG. 15. The hexapole potential can be written as:

$$\phi_3(x, y) \approx \frac{V}{R^3}(x^3 - 3xy^2)$$

For the maximum field $E_{max}$ on the electrodes, one may use the approximation:

$$E_{max} \approx \frac{3V}{R}$$

Figure 14A:
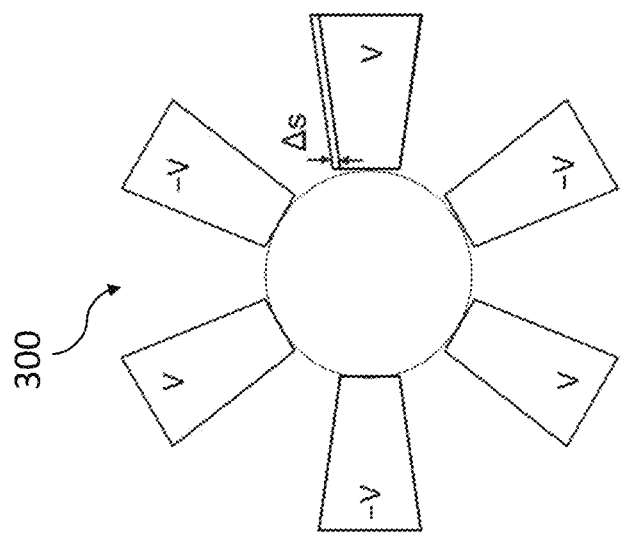
FIG. 14a shows an exemplary electrode component with an exemplary fabrication error.
Figure 14B:
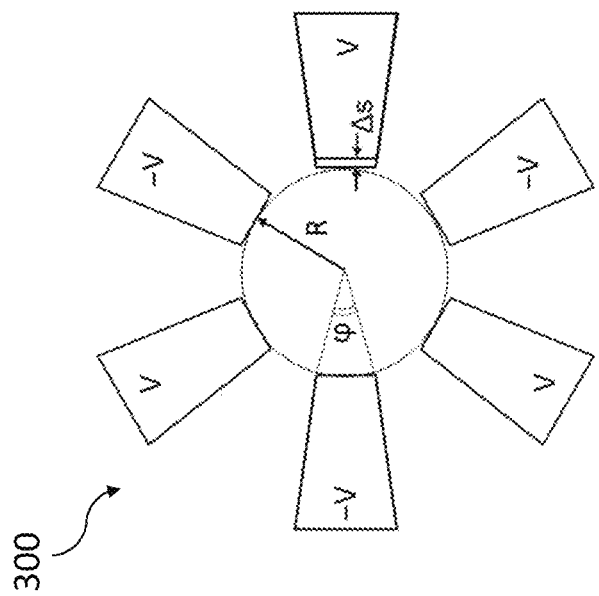
FIG. 14b shows another exemplary electrode component with an exemplary fabrication error.

For an arbitrary error $\Delta s$ in fabricating these elements, where $\Delta s$ represents any error such as a shift, a parasitic potential $\phi_{parasitic}$ is introduced to the main hexapole field, $\phi_3$. The combined effect of errors $\Delta s$ as shown in FIG. 14(a, b) may be estimated (where m denotes the order of anisotropy of the parasitic potential, with m=4 for parasitic octupole fields, for example):

$$\phi_{parasitic} = \sum_m \frac{1}{R^m} \text{Re}[V_m(x+iy)^m], \text{ with } |V_m| < \approx \frac{V\Delta s}{R}.$$

Each (complex) Fourier component $V_m$ may lead to parasitic primary aberrations and combination aberrations. The primary parasitic aberration is m-fold astigmatism with an aberration coefficient of $A_{m-1}$. This parasitic astigmatism may introduce an extra blur on the electron probe (d50 is the corresponding probe diameter which contains 50% of the probe current) at the specimen plane as:

$$d50 = 2^{(3-m)/2}|A_{m-1}|\theta^{m-1}$$

Figure 15:
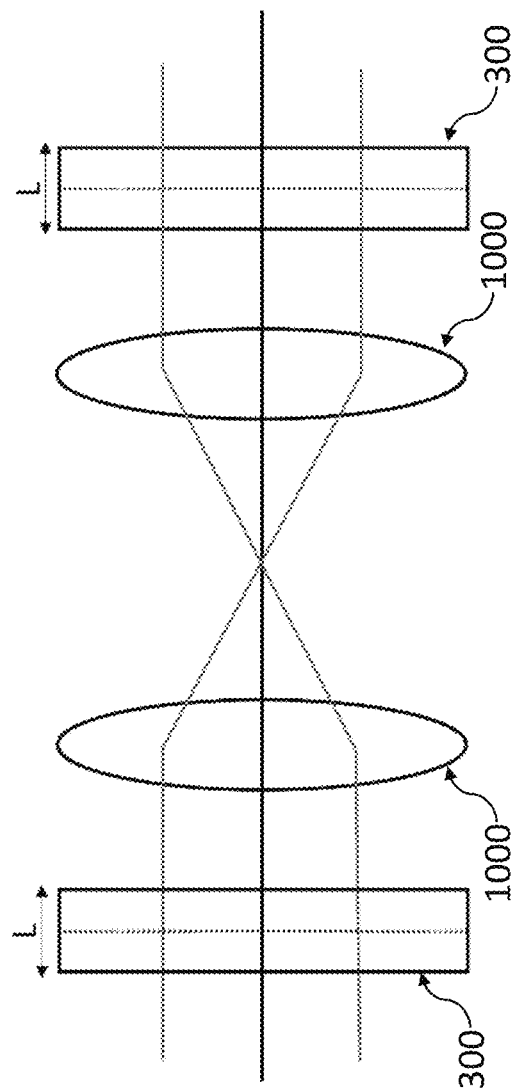
FIG. 15 shows a spherical aberration corrector comprising two exemplary electrode components.

As an example, consider a spherical aberration corrector of the two-hexapole Rose-type sketched schematically in FIG. 15, where a round and parallel electron beam enters the hexapoles 300. A basic calculation of the parasitic m-fold astigmatism yields:

$$|A_{m-1}| \approx \frac{\mathrm{mL}\, E_{max} \Delta s}{6U} \left(\frac{6U^2 C_s}{L^3 E_{max}^2}\right)^m, \quad (1)$$

in which $C_s$ is the spherical aberration coefficient of an objective lens 1000, and U is the beam energy. Thus, the error Δs in fabricating elements may lead to a change in the probe diameter d50, and the change may depend on characteristics such as the effective length L of the electrodes 302(a, b), the beam energy U, or the spherical aberration coefficient of another component.

The desired maximum absolute dimensional tolerance may be determined by, for example, requiring that the probe diameter d50 does not exceed a certain threshold. For example, if the probe diameter d50 in the absence of any geometric or chromatic aberrations would be 1.25 Å, one may require that the probe diameter d50 in the presence of geometric or chromatic aberrations is no greater than 2 Å. This may impose an upper limit on the size of $|A_{m-1}|$ and thus, from equation (1) above, on Δs when suitable values are substituted for other parameters entering equation (1). Generally, in embodiments of the present technology the fabrication process, at least in part, may thus also be based on the maximum absolute dimensional tolerance so determined.

Note that the above discussion should be considered exemplary, but non-limiting, and that it may not be possible to always determine the desired maximum absolute dimensional tolerance by means of an equation such as equation (1). It may also be possible, for example, that the desired maximum absolute dimensional tolerance may be determined based on a desired maximum variation in the effect (such as variation in the probe diameter d50 described above) of the electrode component when used e.g., in a charged particle system. In this case, other methods such as, for example, an artificial-intelligence based method, may be employed to corroborate the desired maximum absolute dimensional tolerance with the desired maximum variation in the effect of the electrode component.

Overall, embodiments of the present invention aim to thus provide an active charged particle optics component for use with high-energy beams that may be fabricated robustly, precisely, and efficiently using the processes described above. Embodiments of the present invention may thus provide an effective avenue to improving the resolution of microscopy systems.

Whenever a relative term, such as "about", "substantially" or "approximately" is used in this specification, such a term should also be construed to also include the exact term. That is, e.g., "substantially straight" should be construed to also include "(exactly) straight".

Whenever steps were recited in the above or also in the appended claims, it should be noted that the order in which the steps are recited in this text may be accidental. That is, unless otherwise specified or unless clear to the skilled person, the order in which steps are recited may be accidental. That is, when the present document states, e.g., that a method comprises steps (A) and (B), this does not necessarily mean that step (A) precedes step (B), but it is also possible that step (A) is performed (at least partly) simultaneously with step (B) or that step (B) precedes step (A). Furthermore, when a step (X) is said to precede another step (Z), this does not imply that there is no step between steps (X) and (Z). That is, step (X) preceding step (Z) encompasses the situation that step (X) is performed directly before step (Z), but also the situation that (X) is performed before one or more steps (Y1), . . . , followed by step (Z). Corresponding considerations apply when terms like "after" or "before" are used.

While in the above, preferred embodiments have been described with reference to the accompanying drawings, the skilled person will understand that these embodiments were provided for illustrative purpose only and should by no means be construed to limit the scope of the present invention, which is defined by the claims.

The invention claimed is:

1. A charged particle beam assembly, particularly a charged particle beam microscope, the assembly comprising:
   an electrode component (302) with at least two electrodes (302a,b), each electrode including silicon, each electrode being provided with a beam neighboring section having an effective thickness of at least 100 μm and a maximum surface roughness of Ra 0.05 μm.

2. The charged particle beam assembly according to claim 1, wherein an electrically insulating substrate (306) is fixed to the electrode component (302) and has at least one substrate beam facing surface(s) flush with the beam facing surfaces (302c).

3. The charged particle beam assembly according to claim 2, wherein the electrode component (302) and the substrate (306) are fixed together by an intermediate layer (304).

4. The charged particle beam assembly according to claim 2, wherein the electrode component (302) comprises at least two indexing markers (408) in order to align the electrode component (302) with any other component, such as the substrate (306).

5. Operation of a charged particle beam assembly with a device according to claim 1, comprising generating a beam voltage of more than 50 KeV.

6. The charged particle beam assembly of claim 1, wherein each beam neighboring section has an effective thickness of at least 1,000 μm.

7. The charged particle beam assembly of claim 1, wherein each beam neighboring section has an effective thickness of at least 500 μm.

8. The charged particle beam assembly of claim 1, wherein the at least two electrodes are configured to be used with a beam having a beam energy of more than 10 KeV.

9. The charged particle beam assembly of claim 1, wherein the at least two electrodes are configured to be used with a beam having a beam energy of more than 15 KeV.

10. The charged particle beam assembly of claim 1, wherein the at least two electrodes are configured to be used with a beam having a beam energy of more than 20 KeV.

11. The charged particle beam assembly of claim 1, wherein the at least two electrodes are configured to be used with a beam having a beam energy of at least 50 KeV.

12. The charged particle beam assembly of claim 1, wherein the at least two electrodes are configured to be used with a beam having a beam energy of at least 100 KeV.

13. The charged particle beam assembly of claim 1, wherein the at least two electrodes are configured to be used with a beam having a beam energy of at least 200 KeV.

14. The charged particle beam assembly of claim 1, wherein at least one electrically insulating substrate (306) is configured to support each of the at least two electrodes.

15. The charged particle beam assembly of claim 14, wherein the at least one electrically insulating substrate (306) has a thickness of at least 100 μm.

16. The charged particle beam assembly of claim 14, wherein the at least one electrically insulating substrate (306) has a thickness of at least 500 μm.

17. The charged particle beam assembly of claim 14, wherein the at least one electrically insulating substrate (306) has a thickness of at least 1000 µm.

18. The charged particle beam assembly of claim 1, the beam neighboring section of each electrode including a beam facing surface having a maximum surface roughness of RA 0.04 µm.

19. The charged particle beam assembly of claim 1, the beam neighboring section of each electrode including a beam facing surface having a maximum surface roughness of Ra 0.025 µm.

20. The charged particle beam assembly of claim 1, the beam neighboring section of each electrode including a beam facing surface having a maximum surface roughness of Ra 0.005 µm.

* * * * *